(12) United States Patent
Fujimura et al.

(10) Patent No.: US 7,148,503 B2
(45) Date of Patent: Dec. 12, 2006

(54) SEMICONDUCTOR DEVICE, FUNCTION SETTING METHOD THEREOF, AND EVALUATION METHOD THEREOF

(75) Inventors: Katsuya Fujimura, Kyoto (JP); Toshiyuki Yokoyama, Kyoto (JP); Kentaro Shiomi, Osaka (JP); Akira Motohara, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 619 days.

(21) Appl. No.: 09/968,898

(22) Filed: Oct. 3, 2001

(65) Prior Publication Data

US 2002/0014699 A1 Feb. 7, 2002

(30) Foreign Application Priority Data

May 10, 2000 (JP) ............................ 2000-305653

(51) Int. Cl.
*H01L 23/58* (2006.01)
*H01L 29/10* (2006.01)
*H01L 29/00* (2006.01)

(52) U.S. Cl. .................. 257/48; 257/529; 257/530; 257/E23.147

(58) Field of Classification Search .............. 257/48, 257/529, 530; 439/516
See application file for complete search history.

(56) References Cited

U.S. PATENT DOCUMENTS

| | | | | |
|---|---|---|---|---|
| 3,573,855 A | * | 4/1971 | Cragon et al. ............... 711/163 |
| 4,877,978 A | * | 10/1989 | Platt ............................ 326/58 |
| 4,978,905 A | * | 12/1990 | Hoff et al. ................... 323/314 |
| 5,110,664 A | * | 5/1992 | Nakanishi et al. ........ 428/195.1 |
| 5,153,450 A | * | 10/1992 | Ruetz ........................... 326/87 |
| 5,157,282 A | * | 10/1992 | Ong et al. ..................... 326/27 |
| 5,162,672 A | * | 11/1992 | McMahan et al. ............. 326/86 |
| 5,276,893 A | * | 1/1994 | Savaria ......................... 714/10 |
| 5,345,112 A | * | 9/1994 | Nazarian et al. ............... 326/39 |
| 5,377,124 A | * | 12/1994 | Mohsen ......................... 716/16 |
| 5,404,553 A | * | 4/1995 | Komori et al. ................ 712/25 |
| 5,430,326 A | | 7/1995 | Miyashita |
| 5,504,354 A | * | 4/1996 | Mohsen ....................... 257/209 |
| 5,537,108 A | * | 7/1996 | Nathan et al. ............... 257/529 |
| 5,539,692 A | * | 7/1996 | Kajigaya et al. ........ 365/189.01 |
| 5,572,409 A | * | 11/1996 | Nathan et al. ............... 361/806 |
| 5,600,267 A | * | 2/1997 | Wong et al. ................... 326/73 |
| 5,701,031 A | | 12/1997 | Oguchi et al. |
| 5,703,747 A | * | 12/1997 | Voldman et al. ............. 361/111 |
| 5,706,578 A | | 1/1998 | Hübner |
| 5,732,027 A | * | 3/1998 | Arcoleo et al. ......... 365/189.05 |
| 5,787,299 A | * | 7/1998 | Ostler et al. ................... 712/39 |
| 5,808,351 A | * | 9/1998 | Nathan et al. ............... 257/528 |

(Continued)

FOREIGN PATENT DOCUMENTS

EP 442474 A2 * 8/1991

(Continued)

*Primary Examiner*—David E. Graybill
(74) *Attorney, Agent, or Firm*—McDermott Will & Emery LLP

(57) ABSTRACT

The present invention provides a semiconductor device, in which a plurality of chip IPs are mounted onto a common semiconductor circuit board, an evaluation method for the same, and a function setting method for the same. Various IP groups can be mounted as chip IPs onto a silicon circuit board. The silicon circuit board includes a silicon substrate, a wiring layer and pads. IPs (chip IPs) are mounted onto the pads by lamination. Means for selecting, switching and setting the functions of the IPs are provided, making the semiconductor device suitable for small-variety mass-production.

30 Claims, 21 Drawing Sheets

U.S. PATENT DOCUMENTS

| | | | | |
|---|---|---|---|---|
| 5,813,881 A | * | 9/1998 | Nathan et al. | 439/516 |
| 5,821,770 A | * | 10/1998 | Rees | 326/38 |
| 5,959,489 A | * | 9/1999 | Walck | 327/333 |
| 5,963,609 A | * | 10/1999 | Huang | 375/377 |
| 5,968,155 A | * | 10/1999 | Davidson | 710/305 |
| 5,973,340 A | * | 10/1999 | Mohsen | 257/209 |
| 5,982,043 A | * | 11/1999 | Iwata | 257/786 |
| 6,000,013 A | * | 12/1999 | Lau et al. | 711/119 |
| 6,038,647 A | * | 3/2000 | Shimizu | 711/168 |
| 6,151,289 A | * | 11/2000 | Rope et al. | 369/95 |
| 6,160,276 A | * | 12/2000 | Mohsen | 257/209 |
| 6,160,653 A | * | 12/2000 | Davidson | 398/164 |
| 6,175,312 B1 | * | 1/2001 | Bruwer et al. | 340/5.1 |
| 6,267,779 B1 | * | 7/2001 | Gerdes | 607/89 |
| 6,356,958 B1 | * | 3/2002 | Lin | 710/1 |
| 6,385,739 B1 | * | 5/2002 | Barton et al. | 714/25 |
| 6,496,033 B1 | * | 12/2002 | Rees | 326/38 |
| 6,515,505 B1 | * | 2/2003 | Rees | 326/38 |
| 6,606,707 B1 | * | 8/2003 | Hirota et al. | 713/172 |
| 2001/0039646 A1 | * | 11/2001 | Mohsen | 716/16 |
| 2002/0175398 A1 | * | 11/2002 | Lan et al. | 257/679 |
| 2004/0168826 A1 | * | 9/2004 | Jiang et al. | 174/261 |

FOREIGN PATENT DOCUMENTS

| | | | |
|---|---|---|---|
| EP | 0 851 351 A | | 7/1998 |
| JP | 55073982 A | * | 6/1980 |
| JP | 60-105252 A | | 6/1985 |
| JP | 61-079240 A | | 4/1986 |
| JP | 63014262 A | * | 1/1988 |
| JP | 04137150 A | * | 5/1992 |
| JP | 05-063082 A | | 3/1993 |
| JP | 05090361 A | * | 4/1993 |
| JP | 05-173824 A | | 7/1993 |
| JP | 06-204395 | | 7/1994 |
| JP | 07-211868 A | | 8/1995 |
| JP | 08-167703 | | 6/1996 |
| JP | 09-097839 A | | 4/1997 |
| JP | 10-187481 A | | 7/1998 |
| JP | 10-284632 A | | 10/1998 |
| JP | 11-017052 | | 1/1999 |
| JP | 11-040739 | | 2/1999 |
| JP | 11-111913 | | 4/1999 |
| JP | 2000-036562 A | | 2/2000 |
| JP | 2000-091435 A | | 3/2000 |
| JP | 2000-208582 A | | 7/2000 |
| JP | 2000353865 A | * | 12/2000 |

* cited by examiner

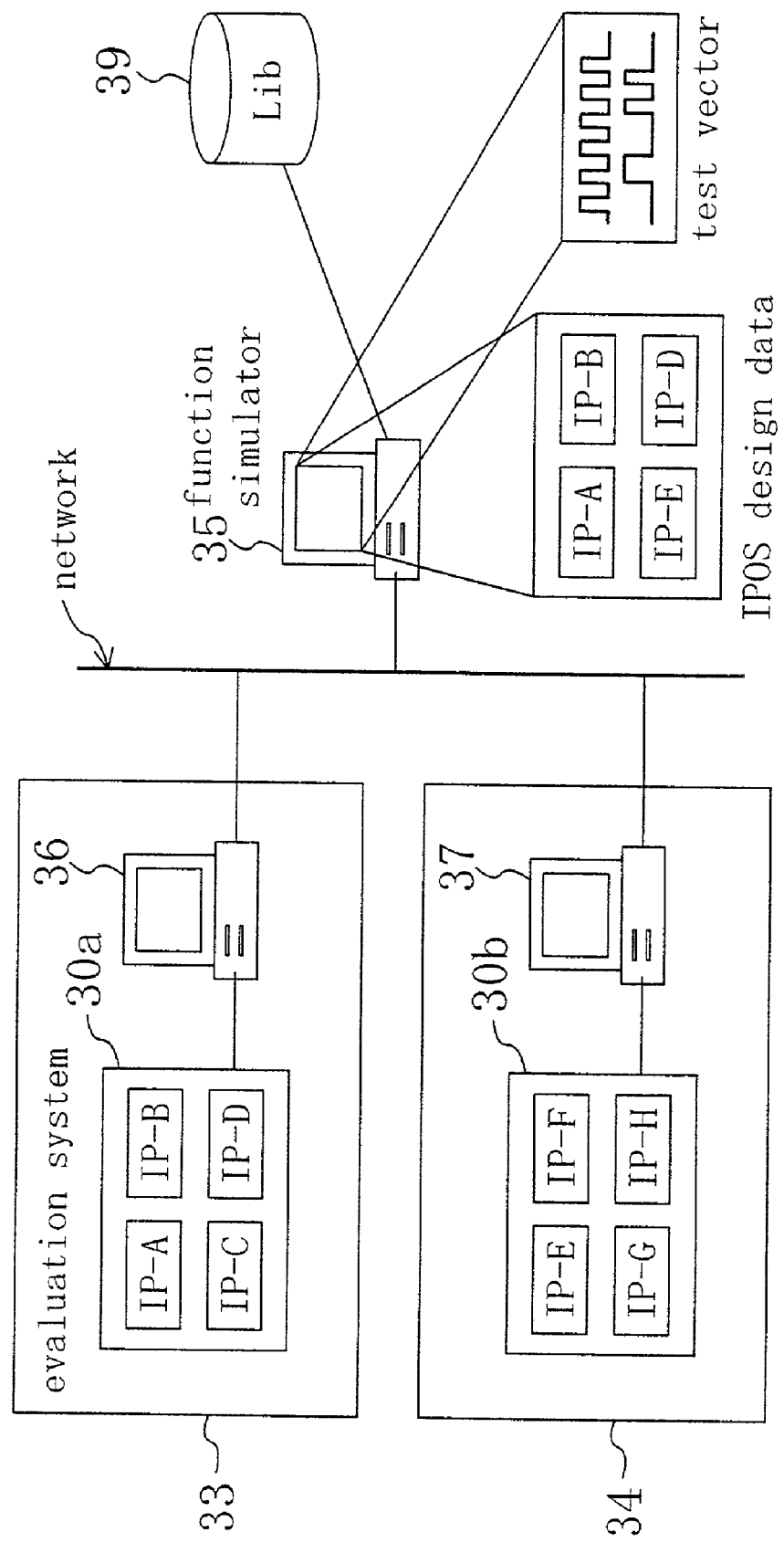

IPOS Device

FIG. 26
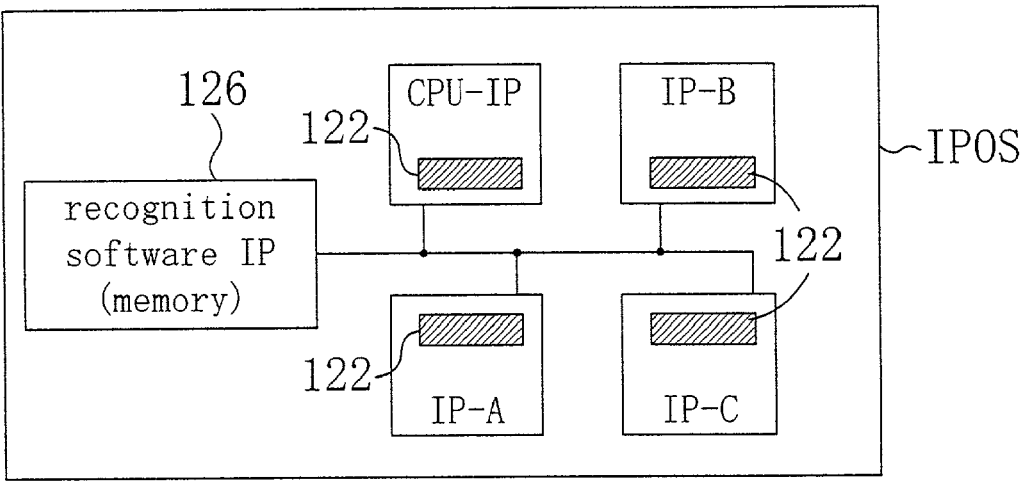 ID information
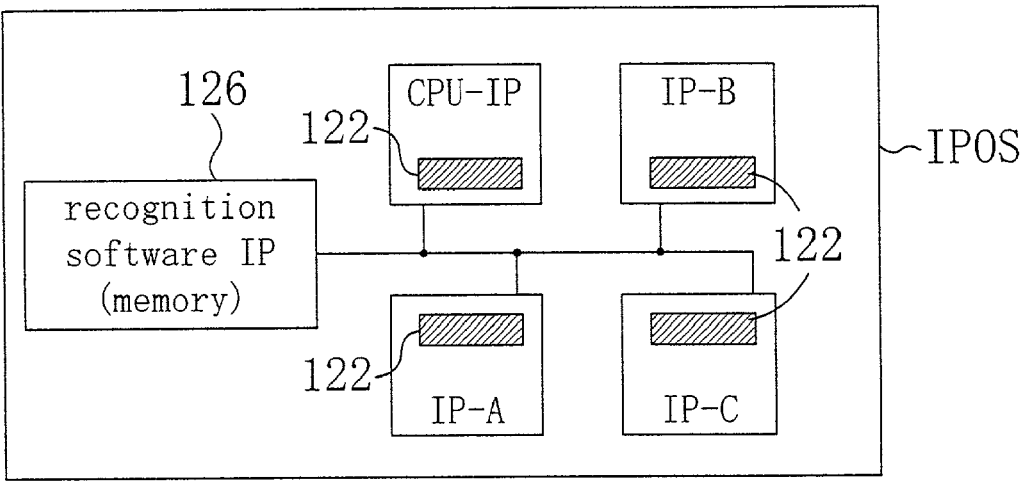

SEMICONDUCTOR DEVICE, FUNCTION SETTING METHOD THEREOF, AND EVALUATION METHOD THEREOF

BACKGROUND OF THE INVENTION

The present invention relates to a semiconductor device in which a variety of chip IPs are installed on a semiconductor circuit board that is provided with a wiring layer, an evaluation method thereof, and a function setting method thereof.

Recently, the concept of a system LSI with a plurality of LSIs formed on a common substrate has been introduced, and a variety of proposals for design methods for a system LSI have been made. The particular advantages of a system LSI are that memory, for example DRAM, logic LSIs, and analog circuits, such as high-frequency circuits, are stored within a single semiconductor device, and that it is possible to attain an extremely high integration of semiconductor devices of multiple types and multiple functions.

The above-described conventional system LSIs encounter the following problems when the devices are actually formed.

A first problem is that it is difficult to reduce the production cost of the devices. The reason for this is that the cost of development for system LSIs significantly increases, and production yield does not particularly improve.

A second problem is that wiring delays significantly increase. In general, when shrink rules are followed, the height of the device is also lowered, but when that happens, wiring delays depending on RC (R is resistance, C is parasitic capacitance) increase as the cross section of the wires becomes smaller. That is, as far as wiring delays are concerned, miniaturization causes more disadvantages than advantages. One approach to remedy this is to provide a buffer within the wires, however, providing a buffer invites other disadvantages, such as the increase in the area occupied by the device and its power consumption.

A third problem is that it is difficult to reduce noise. Lowering the power source voltage increases the electric current, but it is difficult to inhibit the increase in noise that accompanies this increase in electric current. This is because the SN ratio worsens in proportion to a third power to sixth power of the shrinking ratio, and thus an increase in noise due to miniaturization cannot be avoided. That is, how power source impedance is inhibited is a key factor.

Here, as one approach for securing a large cross section of wiring while achieving a semiconductor device incorporating devices of multiple types and multiple functions, it was thought that semiconductor devices would be achieved that are suitable for low-variety mass-production by the implementation of a chip IP, in which a variety of elements are integrated, onto a semiconductor circuit board, for example a silicon circuit board, having a wiring layer. However, the LSIs within a conventional chip IP are designed as hardware for the IP (hard IP), and the function of this hard IP is unique and fixed like a black box, and thus the structure itself does not meet demands for adaptability to various applications or for a reduction in variety. That is, using conventional methods for building a system LSI, it is difficult to attain semiconductor devices suitable for low variety mass-production.

SUMMARY OF THE INVENTION

It is an object of the present invention to provide a semiconductor device suitable for low-variety mass-production by mounting chip IPs that can become the design assets in the form of IP on a shared semiconductor circuit board, while providing means for evaluating, selecting and setting functions of the chip IPs, as well as to provide an evaluation method for the same and a function setting method for the same.

A first semiconductor device in accordance with the present invention includes a semiconductor circuit board having a wiring layer; and a plurality of evaluation chip IPs that are mounted by lamination on the semiconductor circuit board, and that each have at least one function.

Thus, it is possible to provide a semiconductor device functioning as a catalog for evaluating whether the functions of the evaluation chip IPs mounted on the semiconductor circuit board meet the desired purpose.

It is preferable that the wiring layer of the semiconductor circuit board comprises a normal operation wiring layer and an evaluation wiring layer provided above the normal operation wiring layer; and the evaluation chip IPs are electrically connected to at least the evaluation wiring layer, so that after the evaluation is finished, a semiconductor device utilizing the semiconductor circuit board and used for the normal operation can be provided fast and inexpensively by removing the evaluation wiring layer.

A second semiconductor device in accordance with the present invention includes a semiconductor circuit board having a wiring layer; a plurality of chip IPs that are mounted by lamination on the semiconductor circuit board, and that each have a plurality of functions; and a function selection means for activating only a portion of the plurality of functions of the plurality of chip IPs.

Thus, it is possible to use only those functions that are necessary for the application of the semiconductor device, without using all functions in the semiconductor device, so that the power consumption during usage can be reduced and a faster operation can be ensured. On the other hand, by providing as many functions as possible, it is possible to maximally reduce the number of types of semiconductor devices, so that a semiconductor device suitable for lower-variety mass-production can be obtained.

The function selection means can be a logic signal applied to the plurality of functions, a selector that is connected to the plurality of functions, receives a logic input, and outputs only said portion of functions, or a connection means for connecting said portion of functions to the wiring layer of the semiconductor circuit board.

It is preferable that said wiring layer is provided with a power source wiring for supplying a power source voltage, and a ground wiring for supplying a ground voltage, and if the semiconductor device further comprises a connection means for connecting either the power source wiring or the ground wiring of the semiconductor wiring layer to the selector, the logic input is the power source voltage or the ground voltage.

It is preferable that the semiconductor device further includes a chip IP that is provided on the semiconductor circuit board, that is connected via the wiring layer to the plurality of functions of the plurality of chip IPs, and that has a control circuit that performs control such that only said portion of functions is selected, because this makes a flexible selection of functions possible.

It is preferable that the semiconductor device further includes a storage means for storing which of the plurality of functions are to be activated and which are not to be activated, the storage means being connected to the plurality of functions of the plurality of chip IPs; and a setting means for setting the storage in the storage means such that only said portion of functions are activated. Thus, it is easy to set the functions of the device by control signals.

It is preferable that the setting means is connected to the storage means over a network. Thus, the user can evaluate the semiconductor device quickly without receiving the device itself, so that delivery times and transport costs can be reduced.

A third semiconductor device in accordance with the present invention includes a semiconductor circuit board having a wiring layer; a chip IP that is mounted by lamination on the semiconductor circuit board, and that has a plurality of functions; and a function information storage means for storing function information related to said plurality of functions, the function information storage means being provided in the chip IP.

Thus, functions of chip IPs that were conventionally designed as black box IPs can be easily recognized from outside, so that it is possible to meet the demands of a variety of users with a common semiconductor device.

It is preferable that the function information storage means stores function information by associating said functions with ID numbers.

It is preferable that the function information related to said plurality of functions is formatted so that it can be displayed on a display means.

It is preferable that the semiconductor device further includes another chip IP that is configured so as to determine its own function by receiving said function information of said chip IP. Thus, functions can be selected automatically.

It is preferable that the chip IP is configured to output the function information stored in the function information storage means when receiving a key signal. Thus, it is possible to inform only specified users of the functions of the chip IP.

It is preferable that the semiconductor device further includes an encryption means for encrypting the function information outputted by the function information storage means. Thus, it is possible to keep the functions of the chip IP confidential.

It is preferable that the semiconductor device further includes a decryption means for decrypting and outputting said encrypted function information when a key signal has been received.

A fourth semiconductor device in accordance with the present invention includes a semiconductor circuit board having a wiring layer; a plurality of chip IPs that are mounted by lamination on the semiconductor circuit board, and that each have a plurality of functions; and function information storage means for storing information related to said plurality of functions, the function information storage means being provided in the chip IPs; wherein the plurality of chip IPs are configured so that they can read out function information by accessing the function information storage means of other chip IPs.

Thus, the functions of each chip IP can be determined easily and quickly via the function information storage means in the chip IPs. Then, it is possible to select or switch functions based on this function information, and a semiconductor device can be provided that is suitable for low-variety mass production.

It is preferable that the plurality of chip IPs are each provided with a key signal communication portion for sending and receiving a key signal, and that the chip IPs are configured so that they output the function information stored in the function information storage means when their own key signal communication portion has received the key signal. Thus, it becomes possible to select and switch functions using communication among the chip IPs.

It is preferable that the plurality of chip IPs are configured so as to perform the communication of the function information after the function information of the function information storage means has been decoded into a code that can be mutually recognized. Thus, it is possible to prevent unauthorized persons from seeing the functions of the chip IPs.

It is preferable that the function information storage means store the function information by associating said functions with ID numbers; and the semiconductor device further comprises a function recognition means for recognizing the function information based on its ID number. Thus, the recognition, setting and switching of functions can be carried out fast.

It is preferable that the function recognition means is provided in a chip IP separate to the afore-mentioned chip IPs. Thus, the structure of the other chip IPs does not have to be modified, so that customization can be achieved.

It is preferable that the function recognition means is provided as storage content of a memory. Thus, functions can be easily modified without exchanging chip IPs.

It is preferable that the function recognition means is provided in one piece with the function information storage means in the chip IPs.

It is preferable that the function information storage means comprise a first storage portion storing the lower n bits of an m bit address (with n<m) used in the semiconductor device, and a second storage means storing the upper bits from (n+1) upward of the m bit address as said ID number; and the semiconductor device further comprises a means for judging whether the upper bits from (n+1) upward of the m bit input address match with the ID number of the second storage portion. Thus, it is easy to perform recognition, setting and switching of functions, taking the ID number as the handle.

It is preferable that the plurality of chip IPs are configured such that they can change or set their own functions based on function information of function information storage means in the other chip IPs. Thus, it is possible to automatically adjust the functions of the chip IPs to the optimum functions.

It is preferable that the semiconductor device further includes a control circuit that changes or sets the function of the chip IPs upon receiving storage information of the function information storage means in the chip IPs. Thus, it is possible to achieve smoother communication among the chip IPs.

A fifth semiconductor device in accordance with the present invention includes a semiconductor circuit board having a wiring layer; a plurality of chip IPs that are mounted by lamination on the semiconductor circuit board; and a bus chip IP comprising a bus that connects the chip IPs to one another.

Thus, problems caused by the number of IPs connected to the bus, such as waste of driving capabilities or a limit to the number of IPs, can be rectified, so that it is possible to meet a variety of demands with a maximally shared configuration.

A first method for evaluating a semiconductor device in accordance with the present invention includes a step (a) of mounting, by lamination on a semiconductor circuit board having a wiring layer, a plurality of evaluation chip IPs each having at least one function; and a step (b) of evaluating said at least one function of the evaluation chips by simulation.

With this method, it becomes possible to switch functions, select functions and set functions of a semiconductor device using the evaluation result of the chip IPs.

It is preferable that step (b) is performed by displaying internal documentation storing the function of the chip IPs on a display device.

It is preferable that in step (a), the wiring layer of the semiconductor wiring circuit is formed separated into a normal operation wiring layer and an evaluation wiring layer above the normal operation wiring layer; and the method further includes a step of removing the evaluation wiring layer from the semiconductor circuit board and leaving the normal operation wiring layer, which is performed after step (b). Thus, it is possible to reduce delivery times and costs of the semiconductor device.

A second method for evaluating a semiconductor device includes a semiconductor circuit board having a wiring layer, and a plurality of chip IPs that are mounted by lamination on the semiconductor circuit board; wherein a connection test is performed by exchanging information between corresponding terminals among the plurality of chip IPs.

With this method, it is possible to obtain a semiconductor device with highly reliable connections among the chip IPs.

In a first method for function setting of a semiconductor device including a semiconductor circuit board having a wiring layer, and a chip IP that is mounted by lamination on the semiconductor circuit board and that has a plurality of functions, settings are performed such that only a portion of the plurality of functions are activated.

Thus, it becomes possible to use only the functions that are necessary for the application of the semiconductor device without using all functions in the semiconductor device, so that the power consumption during usage can be reduced and a faster operation can be ensured. On the other hand, by providing as many functions as possible, it is possible to maximally reduce the number of types of semiconductor devices, so that a semiconductor device suitable for low-variety mass-production can be obtained.

In this case, specific methods for activating only said portion of functions include locking a wiring layout of the wiring layer, locking a logic input supplied to the plurality of functions, allowing only said portion of functions to be read out, remote control over a network, activating only said portion of functions, inputting a clock signal only into said portion of functions, supplying a power source voltage only to said portion of functions, and supplying an input signal only to said portion of functions.

In a second method for function setting of a semiconductor device comprising a semiconductor circuit board having a wiring layer, and a plurality of chip IPs that are mounted by lamination on the semiconductor circuit board, in accordance with function information of only a portion of the plurality of chip IPs, the functions of the other chip IPs are changed or set.

With this method, it is easy to match in particular the functions of chip IPs on an upper level side to the functions of chip IPs on a lower side receiving signals of chip IPs on the upper level side.

In a third method for function setting of a semiconductor device comprising a semiconductor circuit board having a wiring layer, a plurality of chip IPs that are mounted by lamination on the semiconductor circuit board and that each have a plurality of functions, and function information storage means provided on each of the chip IPs and storing function information relating to said plurality of functions, based on the function information of only a portion of the plurality of chip IPs, the functions of the other chip IPs are changed or set. With this method, it becomes possible to optimize the functions in a semiconductor device using only information in the semiconductor device.

BRIEF DESCRIPTION OF THE DRAWINGS

FIG. 7 is a block diagram that schematically shows an evaluation system using remote control for a universal evaluation IPOS device in a fourth specific example of the first embodiment.

FIG. 26 is a block circuit diagram showing the configuration of an IPOS device according to a third specific example of the sixth embodiment.

DETAILED DESCRIPTION OF THE INVENTION

Basic Structure Forming the Premise of the Present Invention

Accordingly, in the present invention, as one means for achieving a semiconductor device that incorporates devices of multiple types and multiple functions, and that concurrently secures a large cross section of wiring, a configuration is used wherein a chip IP incorporating a variety of devices is provided on a semiconductor circuit board having a wiring layer, for example a silicon circuit board (Super-Sub). Also, circuits (IC) provided within each chip IP can be treated as IP (Intellectual Property) for the design of the semiconductor device, and the variety of IPs can be thought of as attached onto the semiconductor circuit board. That is, the entire semiconductor device is an "IP On Super-Sub", so in the embodiments of the present specification, an entire semiconductor device provided with a silicon circuit board and an IP group is referred to as an "IPOS device."

Figure 1A:
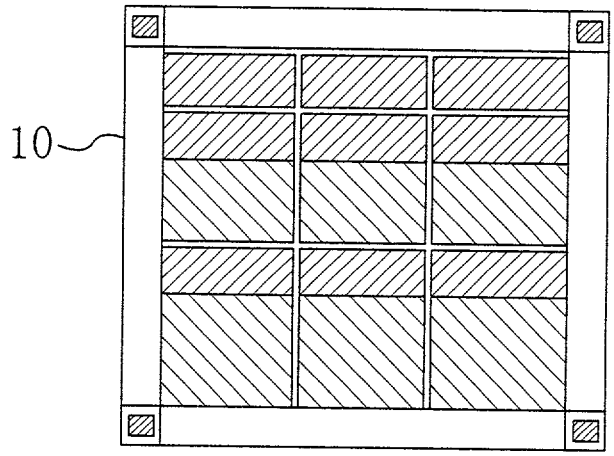
FIGS. 1A, 1B and 1C are respectively a plan view of a silicon circuit board serving as a circuit board for mounting an IP group, a plan view showing an example of an IP group mounted on the silicon circuit board, and a cross-sectional view of the silicon circuit board.
Figure 1B:
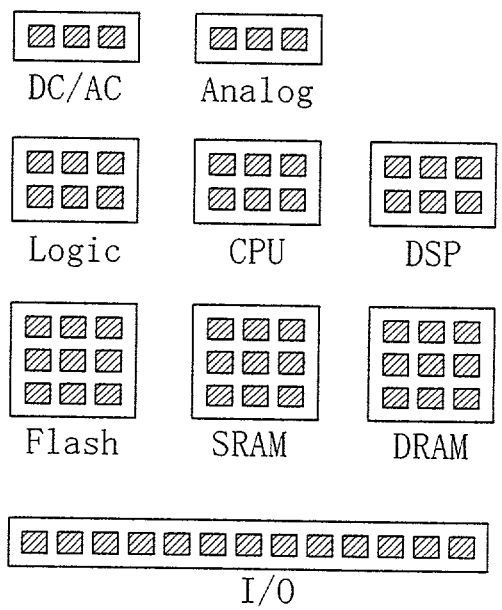
Figure 1C:
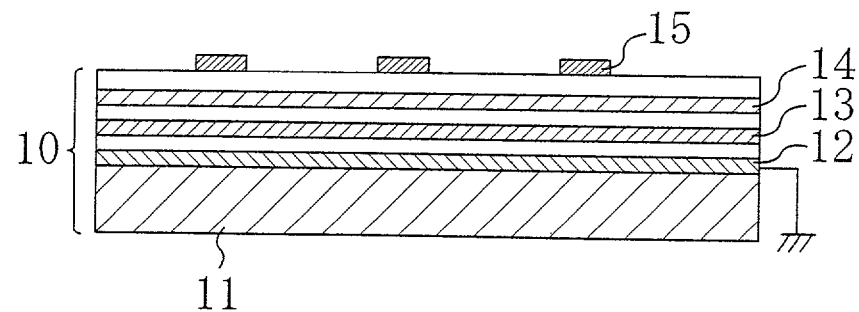

FIGS. 1A, 1B, and 1C are respectively a plan view of a silicon circuit board becoming a circuit board for accommodating an IP (chip IP), a plan view showing an example of an IP group provided on a silicon circuit board, and a cross-sectional view of the silicon circuit board. As shown in FIGS. 1A and 1B, a plurality of regions for mounting various IPs are provided on a silicon circuit board 10, and in these regions, a variety of IP groups can be mounted as chip IPs, for example a DC/AC-IP, an Analog-IP, a Logic-IP, a CPU-IP, a DSP-IP, a Flash Memory-IP, an SRAM-IP, a DRAM-IP, and an I/O-IP. As shown in FIG. 1C, the silicon circuit board 10 includes a silicon substrate 11, a ground plane 12 provided on the silicon substrate 11 sandwiching an insulating film (not shown in the drawings) therebetween, a first wiring layer 13 that is provided on the ground plane 12 and that sandwiches an interlayer insulating film therebetween, a second wiring layer 14 that is provided on the first wiring layer 13 and that sandwiches an interlayer insulating layer therebetween, and pads 15 that are provided on the second wiring layer 14 and that sandwich a passivation film therebetween. The pads 15, the wiring layers 13 and 14, and the ground plane 12 are connected with one another at desired locations via contacts (not shown in the drawings). The IPs are attached onto the pads 15, and are electrically connected by the wiring layers 13 and 14 to one another, or to the ground plane 12.

Because restrictions placed on the dimensions of the wiring layers 13 and 14 within the silicon circuit board 10 are lenient, and wires of several μm width can be provided, the following effects are attained. Experimentally, it has become possible to provide wiring with dimensions from that generation from the course of increasing miniaturization of semiconductor IC devices up to this day, in which the wiring characteristics were the most favorable. Also, the electrical impedance of the wires can be reduced.

Furthermore, chip IPs on a silicon circuit board have a large number of functions, and there are two viewpoints regarding this. The first is that chip IPs should use as many functions as possible, whereas the second is that the functions that they use should be limited. That is to say, it is desirable that chip IPs have a configuration that can respond to diverse methods of use so that a variety of user demands are met, but conversely, they must be limited to a certain function when they are actually used. That is, by satisfying both of these conflicting demands, diverse user demands can be met, and an IPOS device suitable for low-variety mass-production can be built. Accordingly, a means is necessary for selecting, limiting, and setting functions within an IPOS device provided with a variety of functions in advance. This includes a method for evaluating and a method for selecting the functions of chip IPs on a silicon circuit board, and the configuration of the chips, for example. In the present invention, embodiments relating to these various means are described.

FIRST EMBODIMENT

In the present embodiment, configurations relating to measures for evaluating functions on an IPOS device, and the selective use of those functions, are explained.

Figure 2:
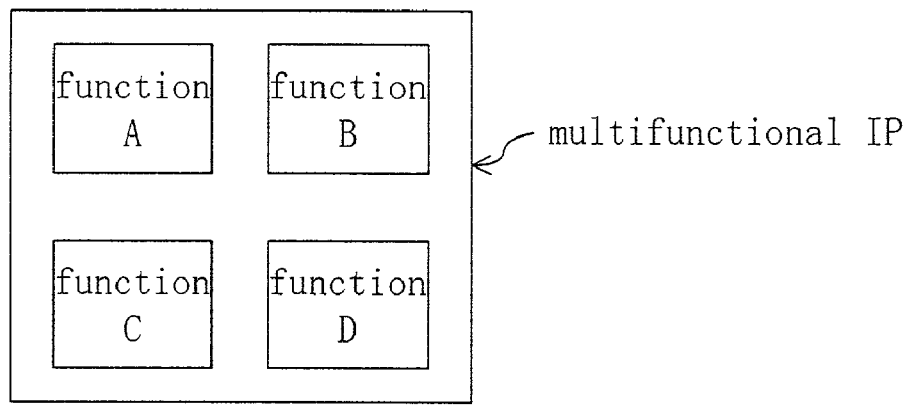
FIG. 2 is a block diagram that schematically illustrates the structure of a multifunctional IP disposed within an IPOS device according to the first embodiment.

FIG. 2 is a block diagram that schematically illustrates the structure of a multifunctional IP (chip IP) disposed within an IPOS device according to the first embodiment. This multifunctional IP incorporates, for example, the four functions of function A, function B, function C, and function D. In general, IPs (chip IPs) within an IPOS device each incorporate a number of functions, and evaluation IPs for evaluating these functions can be provided as an evaluation catalog or as IPs that can also be used as actual chips.

Specific examples regarding methods for evaluating the functions within an IP are described below.

FIRST SPECIFIC EXAMPLE

Figure 3:
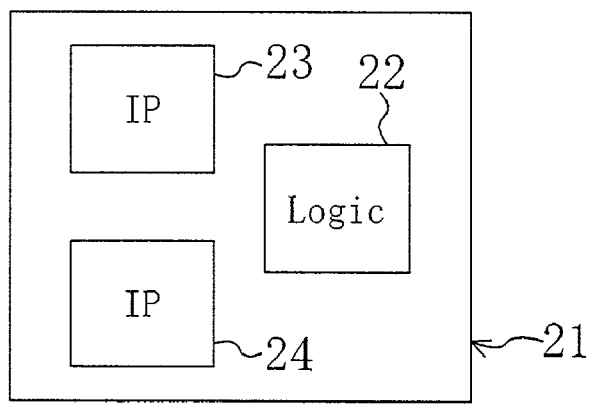
FIG. 3 is a block diagram that schematically shows the configuration of an IPOS device for evaluation in a first specific example of the first embodiment.

FIG. 3 is a block diagram that schematically shows the configuration of an IPOS device for evaluation in this first specific example of the first embodiment. As shown in FIG. 3, an evaluation IPOS device 21 is provided with a user logic 22, and evaluation IPs 23 and 24. The IPOS device 21 evaluates and debugs IPs within the IPOS device 21 before the final product is manufactured, and evaluates the IPOS device as a system. The evaluation IPOS device 21 can itself become the final product, however, generally it does not become the final product. Moreover, the evaluation IPOS device 21 must perform operations such as selecting, changing, and setting IP functions at the time of evaluation. Also, the evaluation IPOS device 21 is configured such that it can search the state of numerous intermediate nodes within the IPOS device. That is, it can read internal information that could not be understood after finalizing the product. Further, when software debugging is finished, extra functions within the IPOS device 21 for evaluation are generally removed so that it can be shipped with a more simplified configuration.

Figure 4:
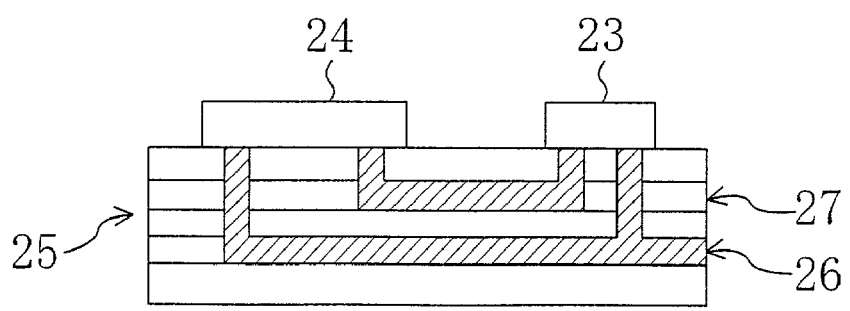
FIG. 4 is a cross-sectional view of an IPOS device for evaluation in a first specific example of the first embodiment.

FIG. 4 is a cross-sectional view of an IPOS device for evaluation according to this specific example. As shown in FIG. 4, a silicon circuit board 25 includes a normal operation wiring layer 26 for use during normal operations, and an evaluation wiring layer 27 that is provided above the normal operation wiring layer 26 and is for use only during evaluation. Furthermore, the evaluation IPs 23 and 24 are connected to the evaluation wiring layer 27 and the normal operation wiring layer 26 via contacts. The evaluation wiring layer 27 is generally used only at the time of evaluation, and is provided above the normal operation wiring layer 26 so that when evaluation is finished and the product is finalized, it is possible to strip away only the evaluation wiring layer 27. In general, the normal operation wiring layer 26 and the evaluation wiring layer 27 are both provided in a plurality of layers. Thus, the IPOS device is configured with the evaluation wiring layers 27 provided above the normal operation wiring layers 26 so that it is possible to strip away only the evaluation wiring layers 27 and leave the normal operation wiring layers 26. That is, although the design is the same, the evaluation wiring layers 27 are provided such that internal signals can be read during debugging, and by simply stripping away the evaluation wiring layers 27 it is possible to form an actual chip. Consequently, it is possible to attain a reduction in manufacturing costs and a shortened delivery period.

SECOND SPECIFIC EXAMPLE

Figure 5:
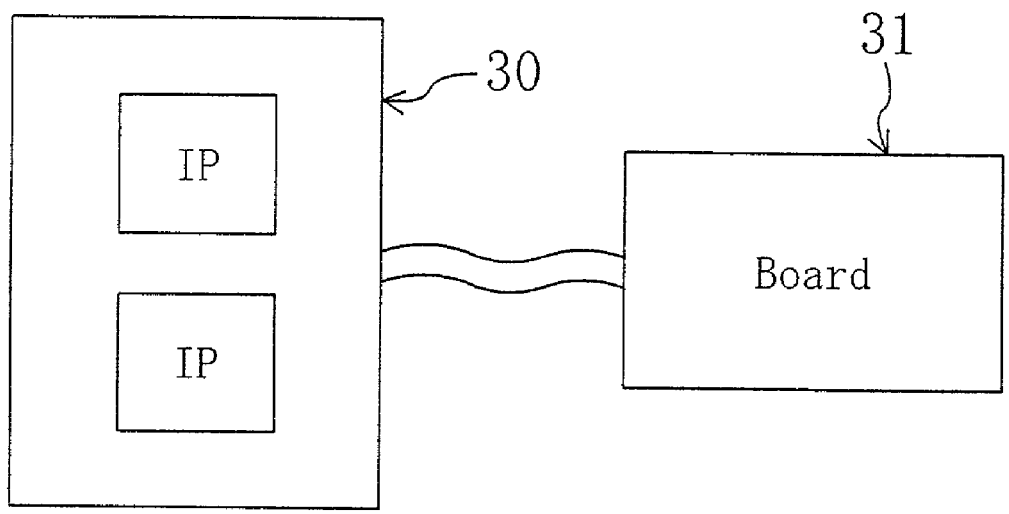
FIG. 5 is a block diagram illustrating the evaluation method of a universal evaluation IPOS device in a second specific example of the first embodiment.

FIG. 5 is a block diagram for describing the evaluation method of a universal evaluation IPOS device in a second specific example of the present embodiment. As shown in FIG. 5, in this case there is no user block mounted on an evaluation IPOS device 30, so a user board 31 (actual board) is used to evaluate the various functions within the evaluation IPOS device 30. Moreover, in this universal evaluation IPOS device 30, normal operation wiring layers are not provided on the silicon circuit board, and only evaluation wiring layers are provided. The IPOS device of this specific example is suitable for being provided to the user particularly as a catalog.

THIRD SPECIFIC EXAMPLE

Figure 6:
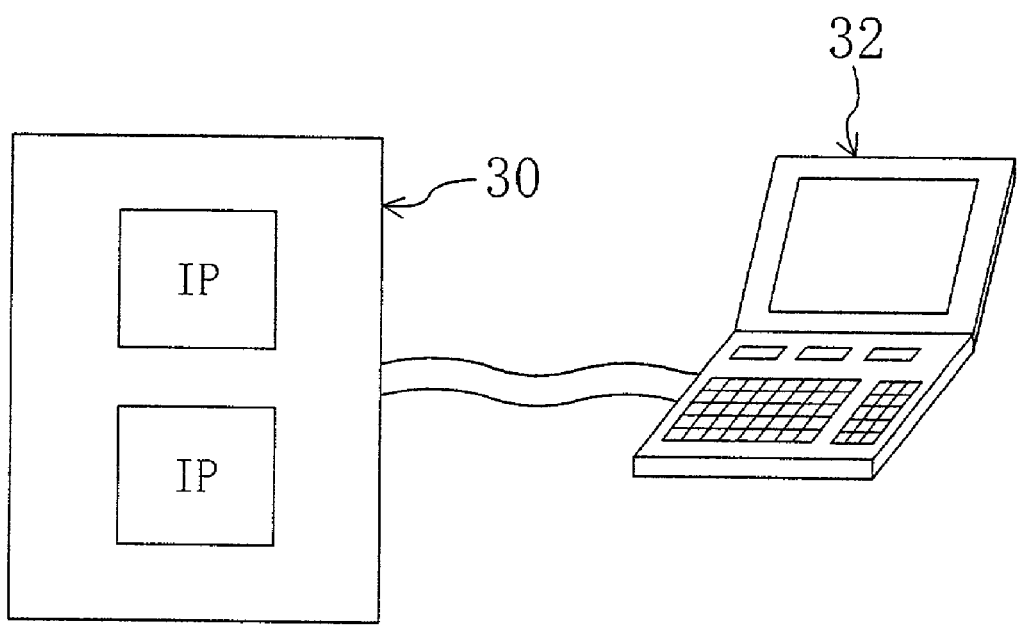
FIG. 6 is a block diagram illustrating the evaluation method of a universal IPOS device for evaluation in a third specific example of the first embodiment.

FIG. 6 is a block diagram for describing the evaluation method of a universal IPOS device for evaluation in a third specific example. As shown in FIG. 6, in this case as well, a user block is not mounted on the evaluation IPOS device 30. Moreover, in this specific example, in place of the actual board of the second specific example, an emulator 32 (or simulator) for software is used to evaluate the various functions within the evaluation IPOS device 30. In this specific example as well, the silicon circuit board in the universal evaluation IPOS device 30 is not provided with normal operation wiring layers, and is provided only with evaluation wiring layers.

FOURTH SPECIFIC EXAMPLE

FIG. 7 is a block diagram that schematically shows an evaluation system using remote control for a universal evaluation IPOS device according to a fourth specific example. As shown in FIG. 7, the system of this specific example is provided with evaluation systems 33 and 34 for the IPOS device, and a function simulator 35 connected to the evaluation systems 33 and 34 by a network. The IPOS device evaluation system 33 is provided with an IPOS device 30a onto which an IP-A, an IP-B, and IP-C, and an IP-D are mounted, and a control system 36 for sending control signals to the IP terminals within the IPOS device 30a, and which is configured such that it receives observation signals of the IPs from terminals of the IPs. The IPOS device evaluation system 34 is provided with an IPOS device 30b onto which an IP-E, an IP-F, and IP-G, and an IP-H are mounted, and a control system 37 for sending control signals to terminals of the IPs within the IPOS device 30b, and which is configured such that it receives observation signals of the IPs from terminals of the IPs. Control signals to the evaluation systems 33 and 34, or observation signals from the evaluation systems 33 and 34, are sent and received by the function simulator 35 via the network.

The function simulator 35 is provided with a library 39. Moreover, the function simulator 35 inputs design data, which is created by a functional descriptive language and functional circuit diagrams, and test vectors, and uses the IPs of the IPOS devices 30a and 30b to conduct a construction simulation of the system. At that time, ID information on the function of IPs in the IPOS device, or information including functional shape symbols or terminal configurations for diagrammatically creating IPOS device design data, is stored in the library 39, and this information can be freely selected to form design data.

The evaluation systems 33 and 34 transmit classification and address information (location information on IPs in the IPOS device and terminals thereof) on IPs within the IPOS devices 30a and 30b to the function simulator 35 via the network. Here, address information can be stored in advance in the library 39 as a database of IPs, or can be obtained during communication with the evaluation systems 33 and 34.

The function simulator 35 transmits IP input vectors, from the address information of IPs corresponding to the IPs used in the design data, to the evaluation systems 33 and 34 via the network, obtains observation signals from the evaluation systems 33 and 34 via the network, and uses these as function simulation results.

Thus, the effects that can be achieved with the present specific example include that it is possible to perform accurate system verification using the operation of IPs on actual IPOS devices, it is possible to perform the real-time verification of operations within the evaluation systems 33 and 34, it is possible to perform function verification even when IPs on an actual IPOS device are not in the place where verification is carried out, and it is possible to perform function simulations flexibly and in detail. That is, conventionally, simulation models were separately created and supplied to users, and users made verifications using these models. If there were actual chips, that made it possible to perform simulation rapidly. Sending actual chips, however, required energy and time. By contrast, in the present specific example, actual chips are not sent to users, and users can rapidly perform simulation on actual chips by remote control.

It should be noted that function simulation can also be performed using a software emulator or debugger, for example, instead of the simulator.

SECOND EMBODIMENT

Next, a second embodiment relating to specific methods for the selection, establishment, and restriction, for example, of functions is described below. For example, when the bus protocol of an IPOS device is created, differences in the type of bus may occur depending on the entire IPOS device, or on separate IPs. Additionally, there may also be a plurality of clock types that are used. In that case, although content-wise they are the same function, a plurality of functions A and B with a different type of bus or clock, for example, are provided in the IPs in advance, and if, depending on user selections, either of the functions A or B are enabled for use, it is easy to match the protocol of the bus and implement the desired functions into the semiconductor device. That is, the structure of an IPOS device suitable for low-variety mass-production is formed, while meeting diverse user demands.

In the following specific examples one to four, for the ease of explanation, only a case wherein one of two types of functions A and B has been selected is described, but the specific examples can also be appropriately applied to a case wherein one function is selected from three or more functions.

FIRST SPECIFIC EXAMPLE

Figure 8A:
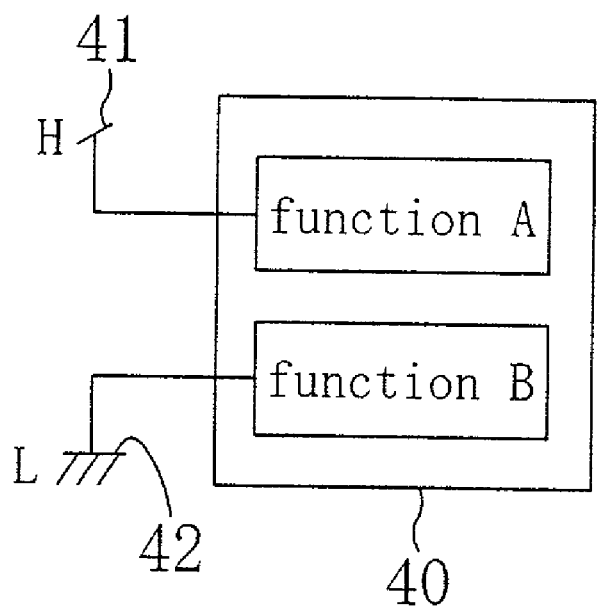
FIGS. 8A and 8B are a plan view of an IP and a partial cross-sectional view of an IPOS device, respectively, according to a first specific example of the second embodiment.
Figure 8B:
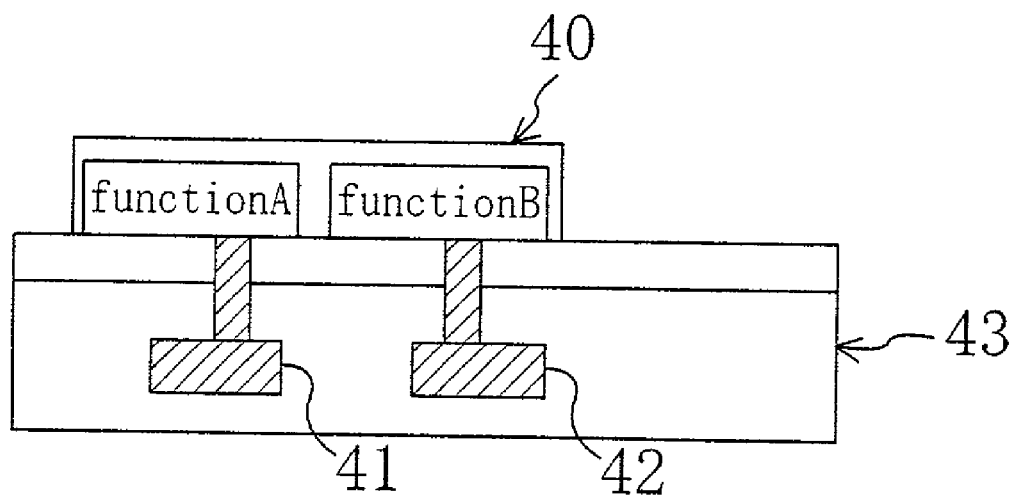

FIGS. 8A and 8B are a plan view of an IP, and a partial cross-sectional view of an IPOS device, respectively, according to a first specific example of the present embodiment. With this specific example, it is presumed that users will create silicon circuit boards. As shown in FIG. 8A, an IP 40 is given that has functions A and B, which in terms of content are the same but have different bus types, for example. Moreover, in this specific example, the functions A and B within the IP 40 are configured such that they are set by the wiring logic within a silicon circuit board 43. For example, as shown in FIG. 8B, function A is pre-connected to a power source wire 41 (power source line) for supplying power source voltage (logical H), and function B is pre-connected to a ground wire 42 (ground line) for supplying ground voltage (logical L). That is, in the present embodiment, the function to be used is selected according to the type of logic applied to the function. Thus, the user can easily set whether to use function A or function B by supplying the a logical H or a logical L signal. In this specific example, the user can also use functions A and B together.

SECOND SPECIFIC EXAMPLE

Figure 9A:
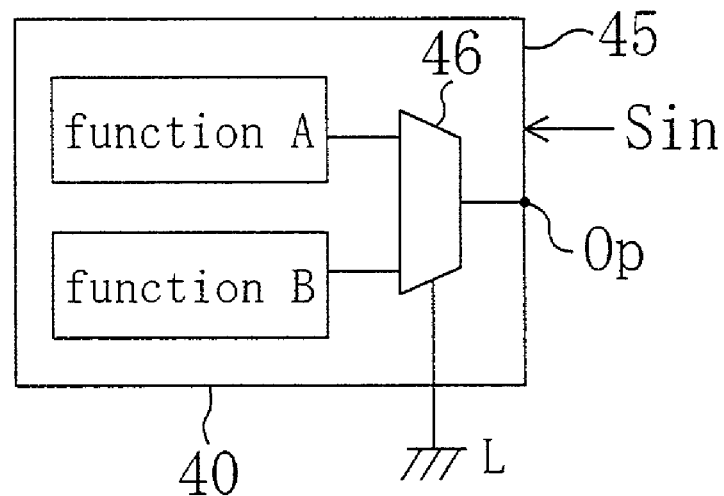
FIGS. 9A and 9B are a plan view of an IP and a partial cross-sectional view of an IPOS device, respectively, according to a second specific example of the second embodiment.
Figure 9B:
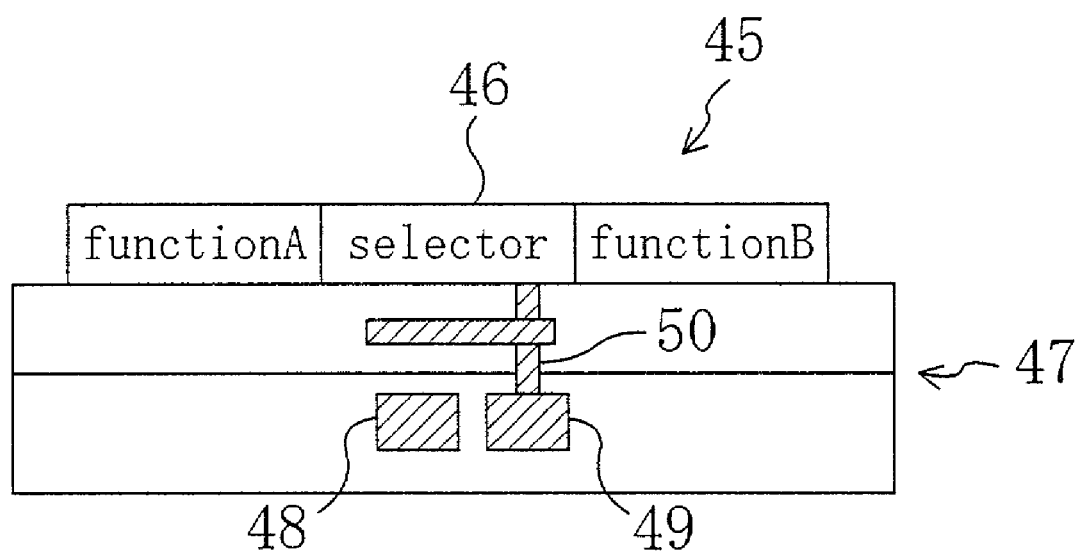

FIGS. 9A and 9B are a plan view of an IP, and a partial cross-sectional view of an IPOS device, respectively, according to a second specific example of the present embodiment. With this specific example, it is presumed that users will create silicon circuit boards. As shown in FIG. 9A, in this specific example as well, an IP 45 is given that has a function A and a function B, which in terms of content are the same but have different bus types, for example. Moreover, the IP 45 is provided with a selector 46 for selecting the function A or function B and outputting that selection to an output terminal Op. In this specific example, as shown in FIG. 9B, a contact 50, which is in connection with the selector 46, is provided in a silicon circuit board 47 on either a power source line 48 or a ground line 49. That is, this specific example is configured such that the function in the IP that is to be used is selected by the contact 50.

THIRD SPECIFIC EXAMPLE

Figure 10A:
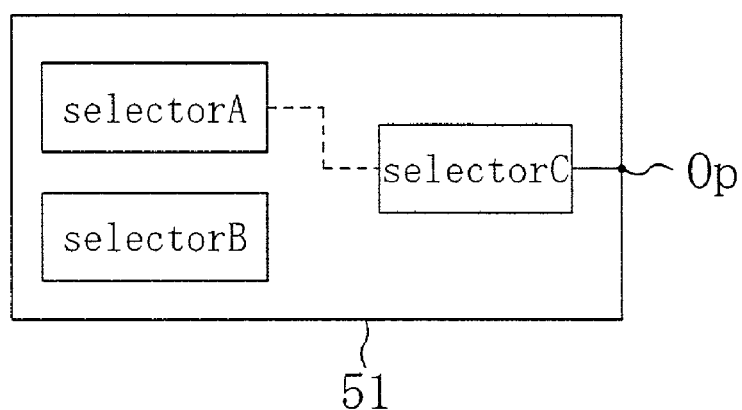
FIGS. 10A and 10B are a plan view of an IP and a partial cross-sectional view of an IPOS device, respectively, according to a third specific example of the second embodiment.
Figure 10B:
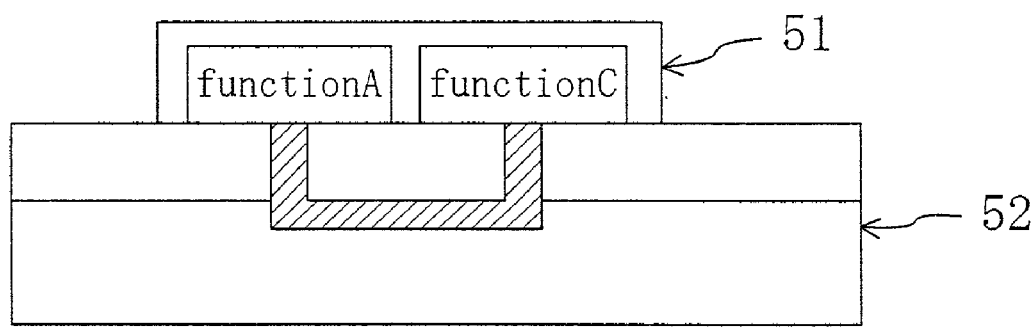

FIGS. 10A and 10B are a plan view of an IP, and a partial cross-sectional view of an IPOS device, respectively, according to a third specific example of the present embodiment. With this specific example, it is presumed that users will create silicon circuit boards. As shown in FIG. 10A, in this specific example as well, an IP 51 is given that has a function A and a function B, which in terms of content are the same but have different bus types, for example. Moreover, the IP 51 is provided with a circuit C which functions as a selector for selecting the function A or function B and outputting that selection to an output terminal Op. As shown in FIG. 10B, in this specific example, by the structure of the wiring in a silicon circuit board 52, either the function A or the function B is switchably connected to the circuit C. That is, the specific example is configured such that the function in the IP that is to be used is selected with the wire itself.

FOURTH SPECIFIC EXAMPLE

Figure 11A:
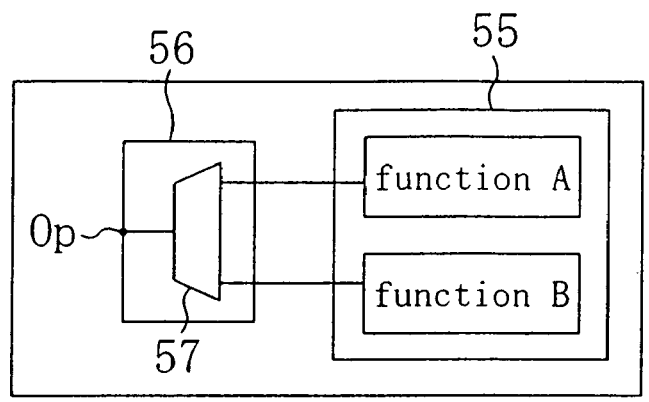
FIGS. 11A and 11B are a plan view of an IP and a partial cross-sectional view of an IPOS device, respectively, according to a fourth specific example of the second embodiment.
Figure 11B:
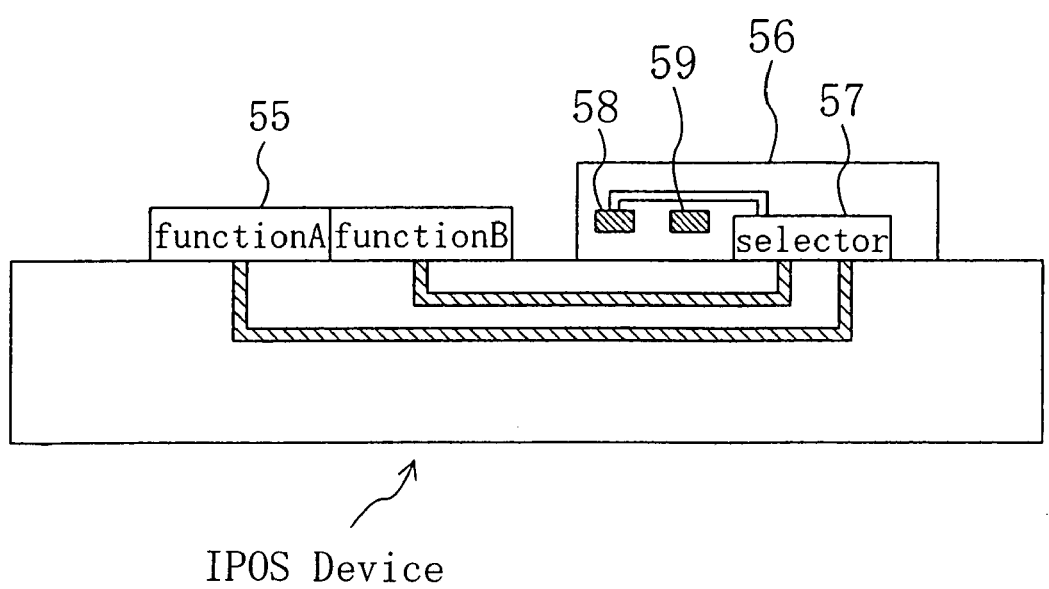

FIGS. 11A and 11B are a plan view of an IP, and a partial cross-sectional view of an IPOS device, respectively, according to a fourth specific example of the present embodiment. With this specific example, it is presumed that not only users but also providers will create silicon circuit boards. As shown in FIG. 11A, in this specific example as well, an IP 55 is given that has a function A and a function B, which in terms of content are the same but have different bus types, for example. Moreover, in addition to the IP 55, the IPOS device is provided with a function selection IP 56 that has a selector 57 for selecting the function A or the function B in the IP 55. As shown in FIG. 11B, in the present specific example, by simply connecting the function A and function B in the IP 55 to the selector 57 in the IP 56 with the wiring in the silicon circuit board, the selection of functions is determined by the relation of the connection in the IP 56 between the selector 57 and a power source line 58 and a ground line 59. That is, in the IP 56, which of the functions A or B is outputted by the selector 57 is selected by whether the power source line 58 or the ground line 59 is connected the selector 57. That is, by separately providing a function selection IP, this specific example is configured such that the function of the IP on the IPOS device that is to be used is selected.

FIFTH SPECIFIC EXAMPLE

Figure 12A:
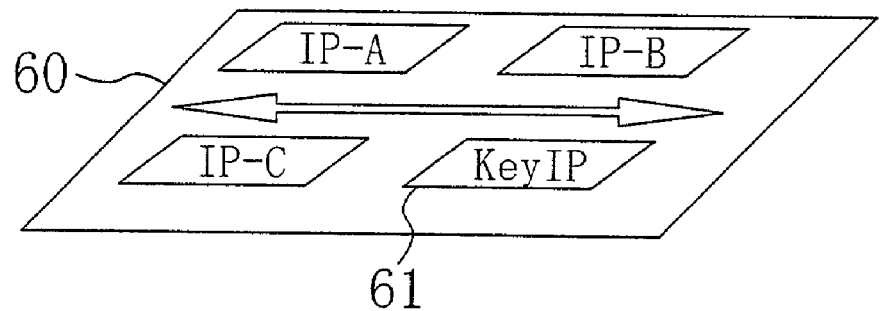
FIGS. 12A and 12B are a perspective view and a block circuit diagram, respectively, showing the configuration of an IPOS device relating to the setting of functions according to a fifth specific example of the second embodiment.
Figure 12B:
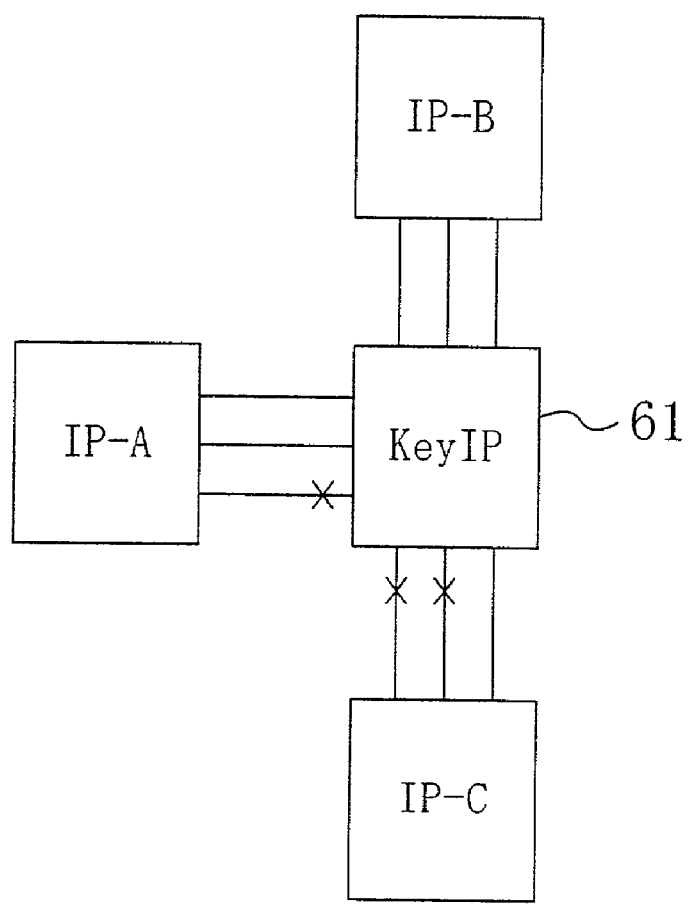

FIGS. 12A and 12B are a perspective view and a block circuit diagram, respectively, showing the configuration of an IPOS device relating to the setting of functions according to a fifth specific example of the present embodiment. With this specific example, it is presumed that not only users but also providers will create silicon circuit boards. As shown in FIG. 12A, the three IPs of IP-A, IP-B, and IP-C, for example, are mounted on a silicon circuit board 60, and the IPs each have a plurality of functions. Moreover, in this specific example, a Key IP 61 is provided for setting a valid function from among the numerous functions in the IPs. That is, as shown in FIG. 12B, the Key IP 61 is in connection with the functions within the IP-A, the IP-B, and the IP-C, via wiring within the silicon circuit board (not shown in the drawings), and a circuit within the Key IP 61 sets which of the wires is to be validly connected. Wires in FIG. 12B attached with an X are the wires that are not used. In this specific example, the structure of the silicon circuit board does not determine which of the numerous functions in the IPs will be valid, and instead valid functions can be uniquely determined simply by changing the Key IP 61. That is, the selection of functions becomes possible by changing the Key IP, or changing software within the Key IP, and thus a more flexible selection of functions is possible.

SIXTH SPECIFIC EXAMPLE

Figure 13A:
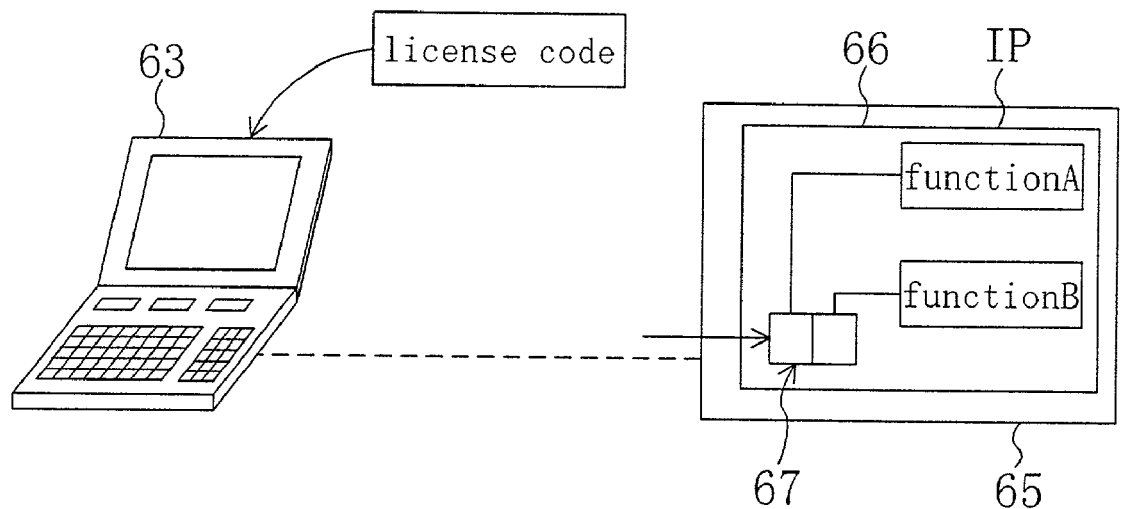
FIGS. 13A and 13B are diagrams which respectively illustrate a function selection method according to a sixth specific example of the second embodiment, and a modified example thereof.
Figure 13B:
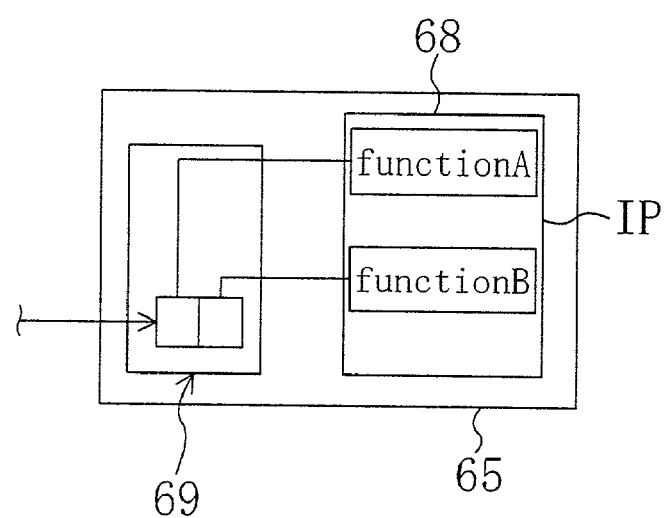

FIGS. 13A and 13B are diagrams which illustrate a function selection method according to a sixth specific example, and a modified example, of the present embodiment. With this specific example, it is presumed, in principle, that providers will create silicon circuit boards. As shown in FIG. 13A, in an IPOS device 65 of this specific example, a function A and a function B within the IP are given, which in terms of content are the same but have different bus types, for example. Moreover, a register 67 is provided within the IP for setting the selection of function A and function B. Also, as shown in FIG. 13B, a register 69, which is for making settings and is a separate IP, can be provided in the IPOS device 65. In this specific example or the modified example thereof, license codes are transmitted from an emulator 68 (or simulator) on the user side to the IPOS device 65, and which of the functions A or B will be used is set by remote control. These license codes are set by license agreements, for example.

With this specific example, the user can quickly perform device evaluation without the semiconductor device itself being handed over to the user, and thus it is possible to attain a shortened delivery period and a reduction of shipping costs.

THIRD EMBODIMENT

Next, a third embodiment relating to a structure and method for making it possible to determine from the outside functions inside IPs disposed in the IPOS is explained below.

Figure 14A:
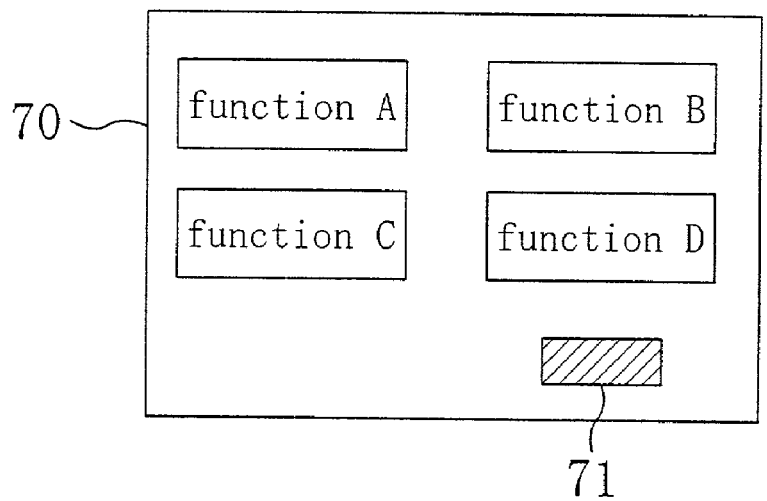
FIG. 14 is a block diagram illustrating the basic structure of an IP disposed within an IPOS device according to a third embodiment.

FIG. 14 is a block diagram illustrating the basic structure of an IP disposed in an IPOS device of the present embodiment. As shown in FIG. 14, there are a number of functions in an IP 70, for example function A, function B, function C, and function D, and the IP 70 is provided with a function information storage portion 71 (memory) on which information pertaining to these numerous functions are registered. Here, specific information content pertaining to these numerous functions includes identification codes, manufacturing history, function category, specifications, and documentation. For the specifications, if a variety of settings are possible, for example, there are settings parameters for performing those settings and the adoptable range, and for performance information, there is the correlation between the power source voltage (V) and the operating speed (MHz), for example.

That is, by providing the function information storage portion 71, which includes this information on internal functions, in the IP 70, the functions within IPs, which were traditionally black boxes, can be easily identified from the outside, and thus functions corresponding to diverse user demands can be provided within the IPOS device with a common IPOS device. That is to say, the structure of the IPOS device is such that it meets diverse demands and at the same time is suitable for low-variety mass-production. Specific examples of the present embodiment are explained below.

FIRST SPECIFIC EXAMPLE

Figure 15:
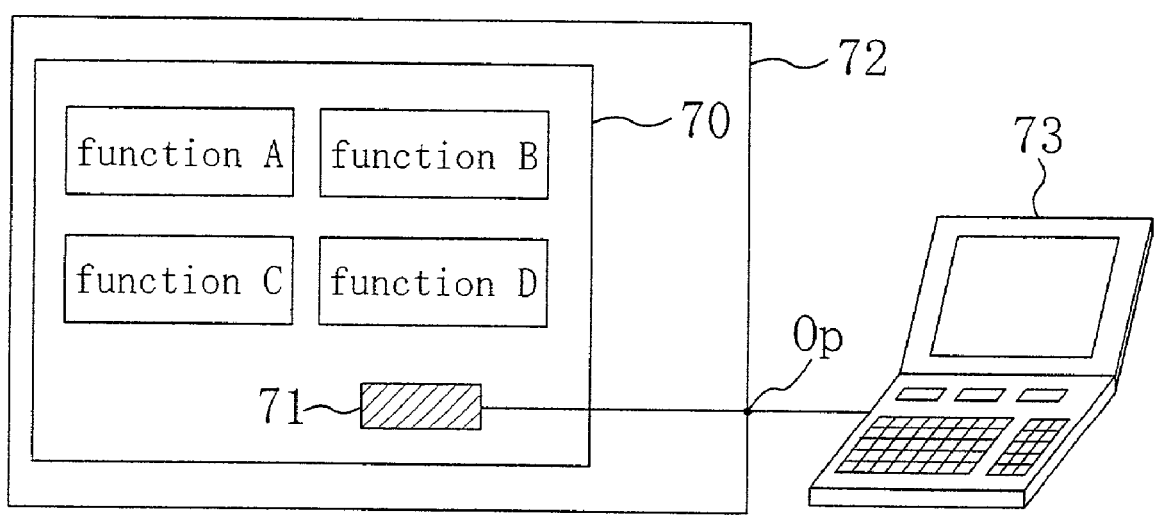
FIG. 15 is a block diagram schematically showing the configuration of an IPOS device according to a first specific example of the third embodiment.

FIG. 15 is a block diagram schematically showing the configuration of an IPOS device according to a first specific example of the present embodiment. In this specific example, after the IP 70 with the function information storage portion 71 is attached into an IPOS device 72, the function information storage portion 71 in the IP 70 is accessed from an external device, which read outs information on functions in the IP 70 from an output terminal Op of the IPOS device 72. Moreover, information relating to the read out functions can be used for performing tests, and can also be used for switching between functions within the IP 70 using software within the external device. Also, if the output terminal Op is connected to a display device 73, documentation within the IP 70 can be browsed on the display device 73. In that case, the function information storage portion 71 in the IP 70 must store information in a format that the external device can read out. For example, the function information should be stored in the function information storage portion 71 in HTML format if a web browser is used.

In particular, with IPOS devices it is necessary to select and switch functions in order to make them suitable for low-variety mass-production, and it is advantageous to provide a means for reading out function information for which there was conventionally almost no need.

SECOND SPECIFIC EXAMPLE

Figure 16:
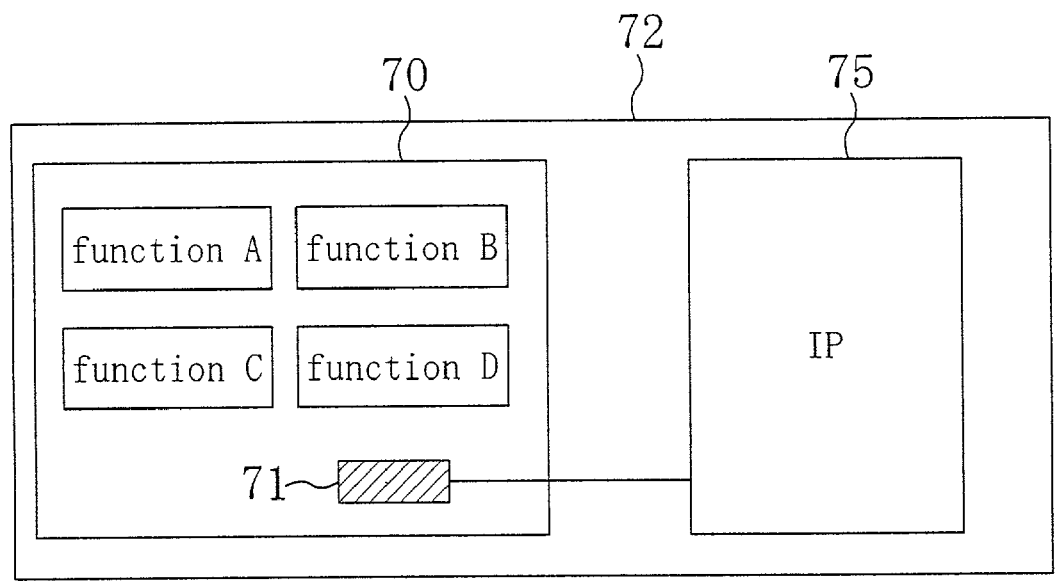
FIG. 16 is a block diagram schematically showing an IPOS device and the configuration of a single IP according to a second specific example of the third embodiment.

FIG. 16 is a block diagram that schematically shows the configuration of an IPOS device and of a single IP according to a second specific example of the present embodiment. In this specific example, as shown in FIG. 16, an IPOS device 72 is provided with an IP 70, which includes function A, function B, function C, function D, and a function information storage portion 71, and an IP 75 for reading out data from the IP 70 to automatically configure itself. That is, the IP 75 accesses the IP 70, reads out data within the IP 70, and sets the values of internal portions in accordance with that data.

This specific example is applicable when, for example, the IP 70 is a CCD, and the IP 75 is a driver for driving a CCD. Here, the IP 70 is a CCD with a pixel number of 100×200, and the IP 75 is a universal driver with a volume that can handle a pixel number of 100×200 or 500×500, for example. In this case, only those terminals of the IP 75, which is the driver, that correspond to 100×200 pixels are activated, and by deactivating all the others, the IP 75 can be automatically configured. With this structure, it is possible to meet diverse demands for low-variety mass production of products, such as digital cameras, in which it is not possible to achieve high performance and low price products using the same IPOS device.

THIRD SPECIFIC EXAMPLE

Figure 17:
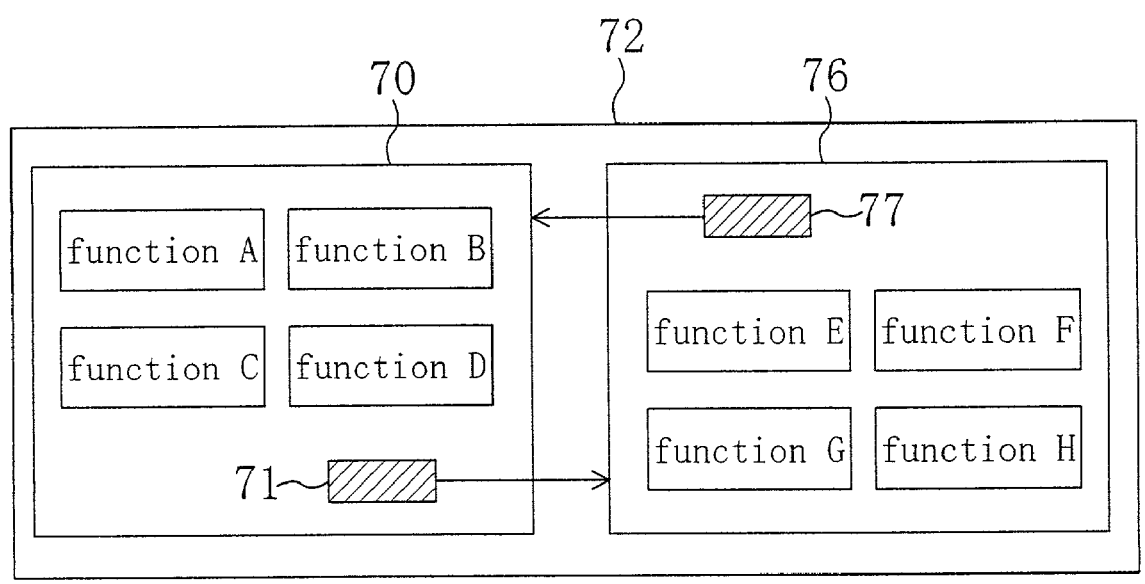
FIG. 17 is a block diagram schematically showing the configuration of an IPOS device according to a third specific example of the third embodiment.

FIG. 17 is a block diagram schematically showing the configuration of an IPOS device according to a third specific example of the present embodiment. In this specific example, as shown in FIG. 17A, an IPOS device 72 is provided with an IP 70, which includes a function A, a function B, a function C, and a function D, and a function information storage portion 71, and an IP 76, which includes a function E, a function F, a function G, and a function H, and a function information storage portion 77. Also, the IP 70 and IP 76 are configured such that they can access the function information storage portions 71 and 77, respectively, of the other IP, and can read out the data therein. In this specific example, the IPs 70 and 76 can use the other IP's data to automatically configure and optimize themselves.

Here, the IPs 70 and 76 can be configured such that when recognizing one another, the matching of pre-set key signals, for example, can be used to read out data. With this configuration, not only is a functional usage method possible, but it is also possible to avoid such problems as having the own value set by a counterfeit IP.

Also, it is preferable that the IPs 70 and 76 encode their own data based on both key signals. The IPs 70 and 76 can be configured such that at this time they can internally decode and use the encoded data, or they can use the encoded data as is without decoding it. Thus, not only is the exchange of data with counterfeit IPs, such as mentioned above, eliminated, but it is possible for the IPs 70 and 76 to perform their own automatic configuration with one another with the data in them kept secret, that is, while preventing functions within the IPs 70 and 76 from becoming discernable from the outside.

Furthermore, by exchanging the information of corresponding terminals in connection between the IPs 70 and 76, it is possible to discern the state of the connection between the terminals with the IPs, for example.

FOURTH SPECIFIC EXAMPLE

Figure 18:
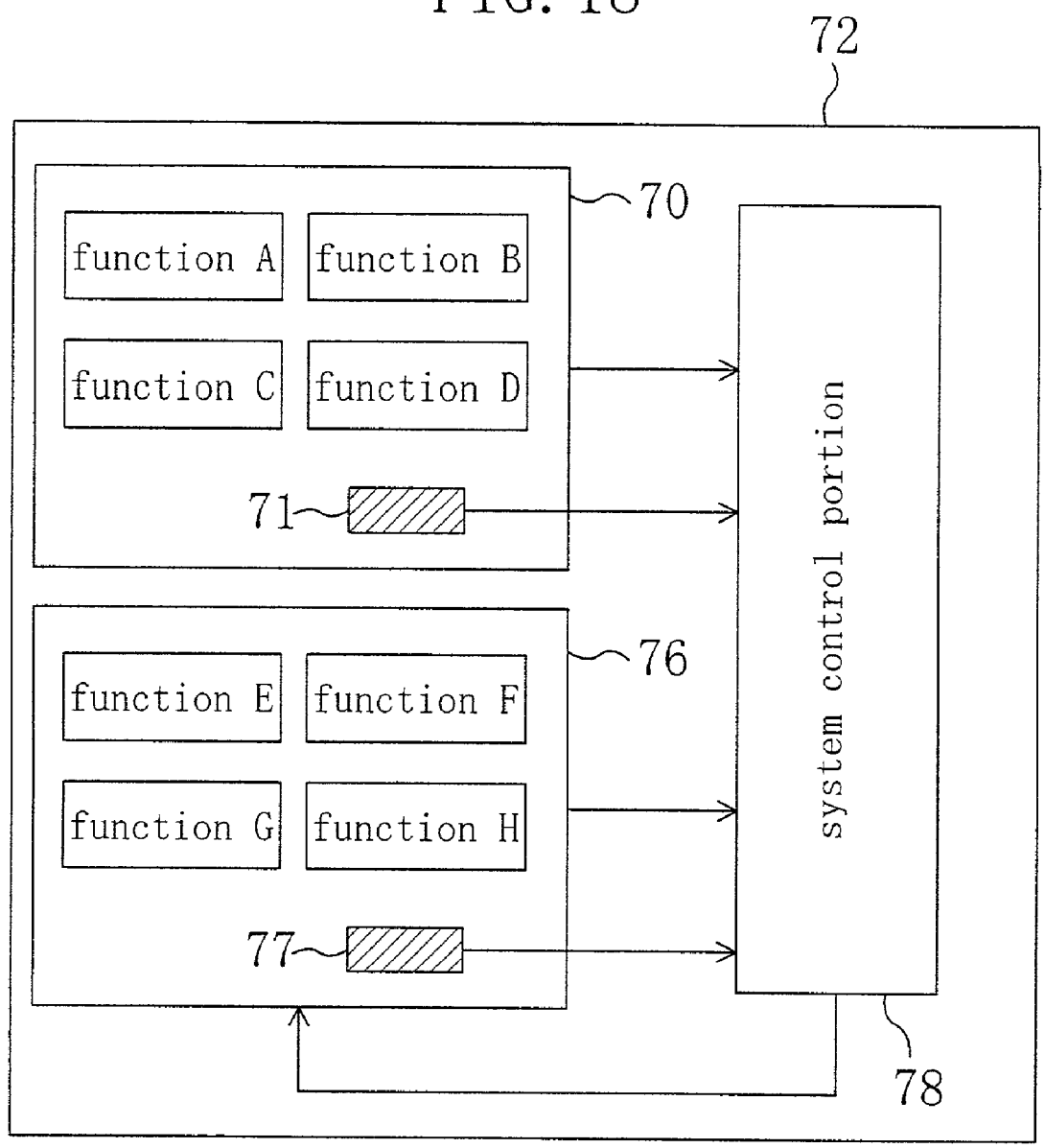
FIG. 18 is a block diagram schematically showing the configuration of the IPOS device in a fourth specific example of the third embodiment.

FIG. 18 is a block diagram schematically showing the configuration of the IPOS device in a fourth specific example of the present embodiment. In this specific example, an IPOS device 72 is provided with an IP 70, which has a function information storage portion 71 for storing information related to a function A, function B, function C, and function D, for example, an IP 76, which has a function information storage portion 77 for storing information related to a function E, function F, function G, and function H, for example, and a system control portion 78 for controlling the entire IPOS device. Moreover, the IPs 70 and 76 send function information from their function information storage portions 71 and 77, respectively, to the system control portion 78, which is configured such that it changes the IPs' settings or performs those settings in accordance with this function information. Thus, smooth communication between the chip IPs can be attained.

Figure 19:
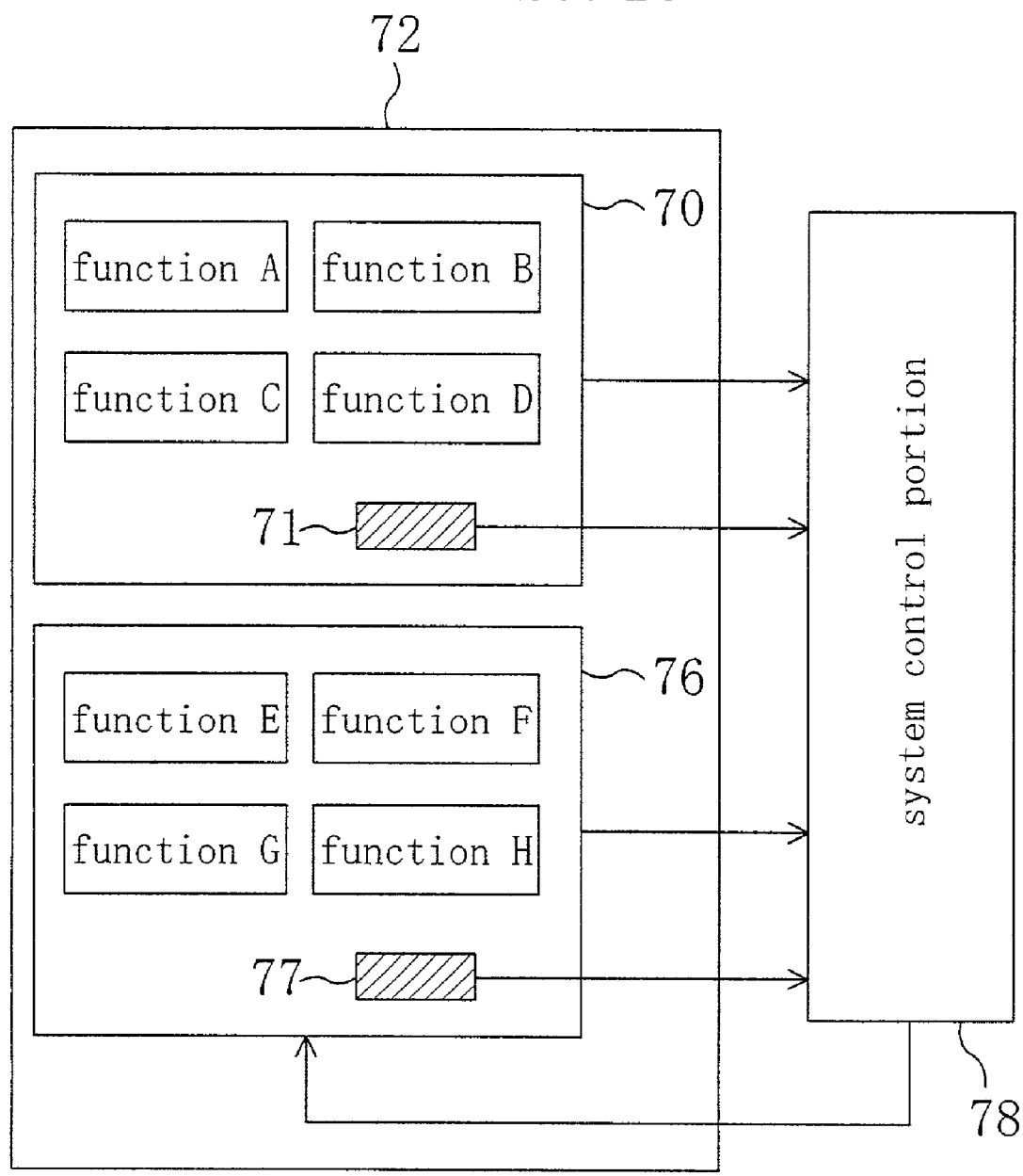
FIG. 19 is a block diagram schematically showing the configuration of an IPOS device according to a variation of the fourth specific example of the third embodiment.

FIG. 19 is a block diagram schematically showing the configuration of an IPOS device according to a variation of this fourth specific example. In this variant example, the system control portion 78 is provided outside, not inside, the IPOS device 72. The same result as attained in the fourth specific example can be attained in this case as well.

FOURTH EMBODIMENT

Conventional system LSIs have the structure of a bus installed as wiring on the substrate, and the IPs are connected to one another by this bus. However, depending on the number of IPs connected to the bus, there may be too much or too little drive capacity for the IPs, drive capacity may be wasted, or other problems such as a limit to the number of installable IPs may occur. Also, bus delays are dependant on the number and arrangement of the IPs, so this became an obstacle when designing large-scale LSIs. Applying this structure as is to the structure of an IPOS device meant that diverse demands could not be met with a configuration as universal as possible, and the advantages of an IPOS device could not be utilized.

In the present embodiment, a method is described for integrating the bus on an IPOS device so that IPOS device characteristics are adequately utilized.

Figure 20:
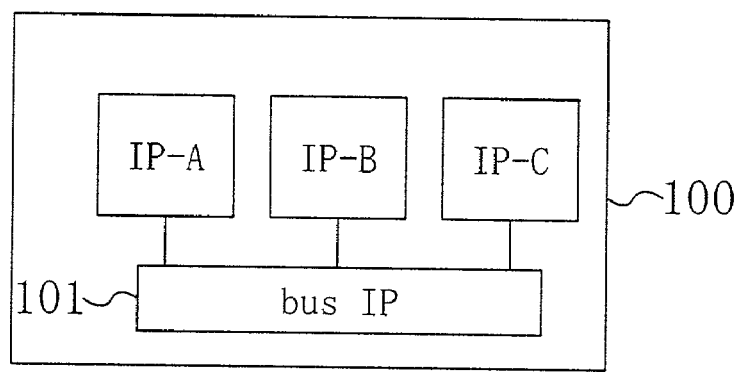
FIG. 20 is a block diagram schematically showing the most basic structure of an IPOS device of the fourth embodiment.

FIG. 20 is a block diagram schematically showing the most basic structure of an IPOS device of the present embodiment. As shown in FIG. 20, an IPOS device 100 is provided with, for example, three IPs, namely IP-A, IP-B, and IP-C, and a bus IP 101 that connects IP-A, IP-B, and IP-C in parallel. The bus IP 101 includes a plurality of terminals for connecting to IP-A, IP-B, and IP-C, and has the function of controlling the switching of the connection between it and the other IPs with which it can connect. According to the present embodiment, IP-A, IP-B, and IP-C should have the drive capacity required for the connection with the bus IP 101. That is, performance regulated by the bus IP is easily ensured without affecting the other IPs. Consequently, problems such as the waste of drive capacity in accordance with the number of IPs connected to the bus, and limitations on the number of IPs, are eliminated, and diverse demands can be met with a configuration that is as universal as possible.

SPECIFIC EXAMPLE

Figure 21:
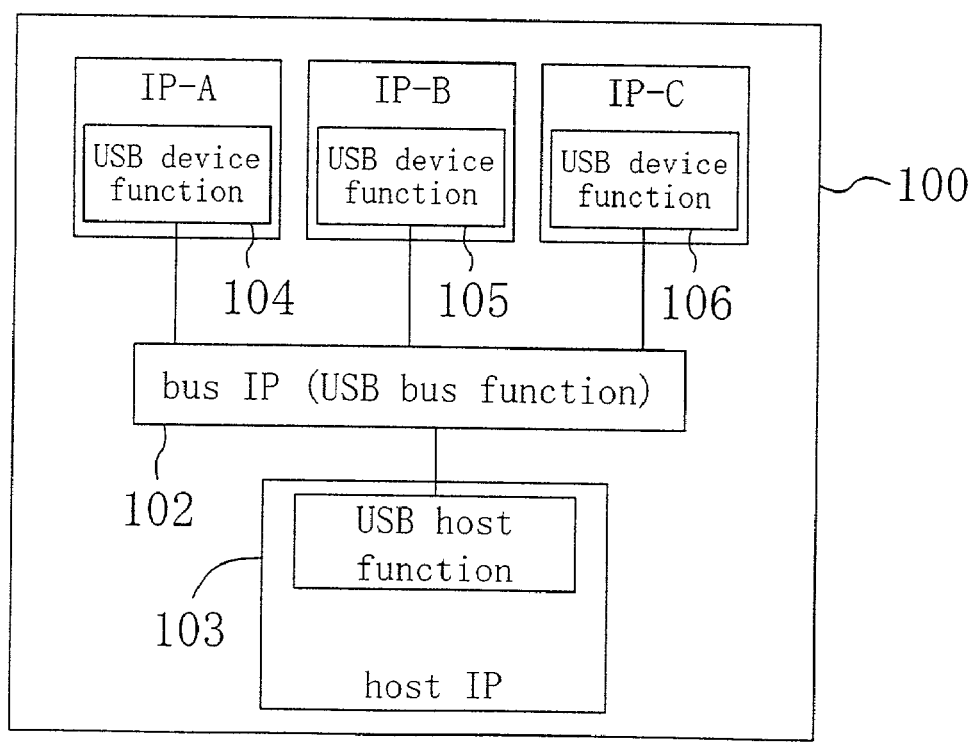
FIG. 21 is a block diagram showing a specific example of the fourth embodiment according to a bus integration system having the configuration of a single host associated with numerous periphery circuits.

FIG. 21 is a block diagram showing a specific example of the present embodiment according to a bus integration system having the configuration of a single host associated with numerous periphery circuits. As shown in FIG. 21, an IPOS device 100 is provided with the three IPs, namely IP-A, IP-B, and IP-C, for example, a bus IP 102 having a USB hub function that connects the IP-A, IP-B, and IP-C in parallel, and a host IP 103 having a USB host function. Additionally, USB device functions 104, 105, and 106 are provided within the IP-A, IP-B, and IP-C, respectively.

That is to say, in the case of a system wherein a single IP on the IPOS device 100 controls the bus as a host IP, the protocol for the USB (Universal Serial Bus) commonly used in personal computer systems is introduced to provide the bus IP 102, which has the USB hub function, and the host IP 103, which has the USB host function, and to provide the USB device functions 104, 105, 106 within the IP-A, IP-B, IP-C, respectively, and thus settings for recognizing IPs connected to the bus do not need to be performed, nor is it necessary to adjust drive capacity. That is, depending on the USB protocol, even if a periphery device or periphery function connected to the bus is changed, it is possible to recognize the concerned periphery device or periphery function without resetting. Here, by using the bus IP 102, which has a USB hub function, it is possible to easily recognize periphery functions and control the bus, even if external conditions are changed by, for example, the number of IPs connected to the bus IP 102 or the selection of functions in a certain IP, and even without performing special processes, such as resetting external conditions.

Also, when the USB protocol is used, a power source line is also installed within the bus, however, in IPOS devices it is unnecessary to install a power source line within the bus because power is supplied to the IPs.

FIFTH EMBODIMENT

Figure 22:
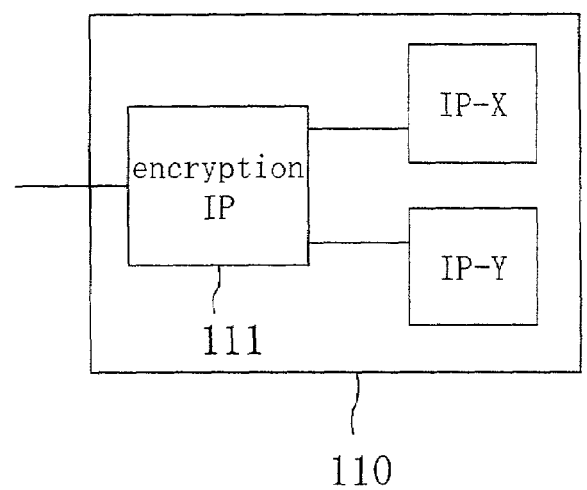
FIG. 22 is a block diagram schematically showing the configuration of an IPOS device according to a fifth embodiment.

FIG. 22 is a block diagram schematically showing the configuration of an IPOS device according to a fifth embodiment. As shown in FIG. 22, an encryption IP 111, which is made of a secret IP-X and a secret IP-Y holding confidential data, and an interface IP of the secret IP-X and the secret IP-Y, is disposed in an IPOS device 110. That is, the encryption IP 111 is configured such that when a signal is communicated between the secret IP-X or secret IP-Y and an external device, it encrypts and decrypts confidential data when sending and receiving signals.

Figure 23:
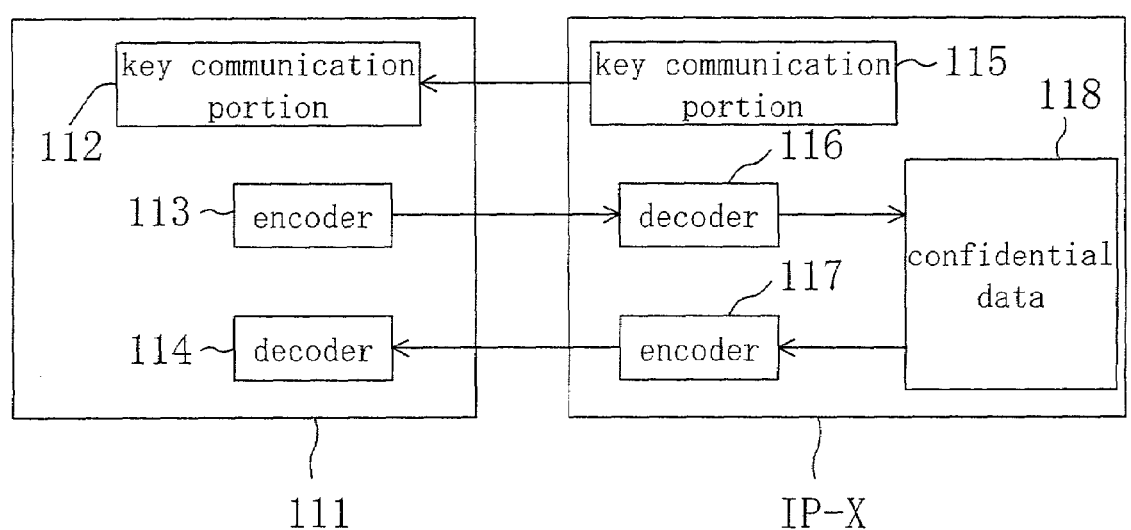
FIG. 23 is a block diagram schematically showing one example of a method of processing signals between an encryption IP and a secret IP in the fifth embodiment.

FIG. 23 is a block diagram showing an example of a method of processing signals between the encryption IP and the secret IP-X. As shown in FIG. 23, the encryption IP 111 is provided with a key communication portion 112 for sending and receiving universal key signals, an encoder 113 for encrypting data, and a decoder 114 for decrypting data. The secret IP-X is provided with a key communication portion 115 for sending and receiving common key signals to/from the key communication portion 112 in the encryption IP 111, a decoder 116, an encoder 117, and a confidential data storage portion 118. That is, when confidential data is transmitted to an external device, a key signal is sent from the key communication portion 115 of the IP-X to the key communication portion 112 within the encryption IP 111, and when the matching of the key signal is confirmed, after confidential data fetched from the confidential data storage portion 118 is encrypted by the encoder 117, it is transmitted to the encryption IP 111. Moreover, once data is decrypted by the decoder 114 within the encryption IP 111, it is sent out to an external device. When receiving confidential data, after performing a process opposite to the one mentioned above via the encoder 113 within the encryption IP 111 and the decoder 116 within the secret IP-X, confidential data is stored in the confidential data storage portion 118.

With this configuration, confidential data is not sent out to an external device as long as the matching of the key signal cannot be confirmed, and data from an external device that is not confidential data is not accidentally recorded. Consequently, it is not possible to use confidential data individually on the secret IP-X or secret IP-Y, or on the IPOS device, so confidential data, for example internal functions stored in the function information storage portions such as those described above in the first embodiment, can be prevented from being analyzed by outside persons.

SIXTH EMBODIMENT

Next, a sixth embodiment relating to the configuration of an IPOS device wherein IPs actually verify one another, and which is required when controlling the IPs with the system control portion or software, is described below. The present embodiment is suitable for performing function selection controls in the above-mentioned third embodiment, for example.

The ID information (identifying information) in the present embodiment is information pertaining to the identification of functions, and relates to bus interface, memory capacity, and register mapping, for example. Moreover, by using this ID information, a function recognition IP can automatically set functions requested by the host into peripheral IPs, and conversely, it can automatically limit the function of the host rather than the functions of peripheral IPs. For example, a case wherein peripheral IPs have a variety of bus interfaces, such as for an A bus, B bus, C bus, etc., and the host side wishes to limit those such that it uses the A bus.

In such as case, there are the methods of the following specific examples for performing the selection and limitation, for example, using ID information.

FIRST SPECIFIC EXAMPLE

Figure 24:
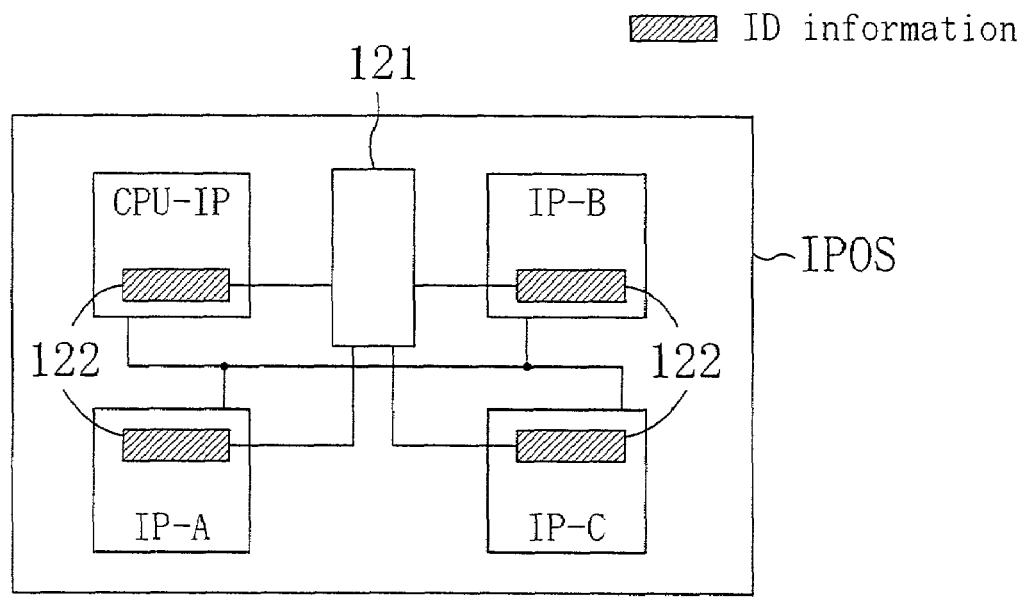
FIG. 24 is a block circuit diagram showing the configuration of an IPOS device according to a first specific example of a sixth embodiment.

FIG. 24 is a block circuit diagram showing the configuration of an IPOS device according to a first specific example of the present embodiment. As shown in FIG. 24, the IPOS device of this specific example is provided with a CPU-IP, a function recognition IP 121, and peripheral IPs IP-A, IP-B, and IP-C, and the CPU-IP, IP-A, IP-B, and IP-C incorporate ID information 122. Moreover, with respect to the ID information 122 in the IPs, the function recognition IP 121 reads out the ID information of the IPs during initialization, and stops unnecessary functions within the IPs. For example, controls are performed to stop an unnecessary clock function.

Thus, the effects that can be achieved include being able to reduce power consumption without changing the IP, the ability to detect degenerative damage of unnecessary circuits, and it becomes possible to customize functions simply by attaching the function recognition IP (chip) to the silicon circuit board after that chip is configured as an LSI for a specific application.

SECOND SPECIFIC EXAMPLE

Figure 25:
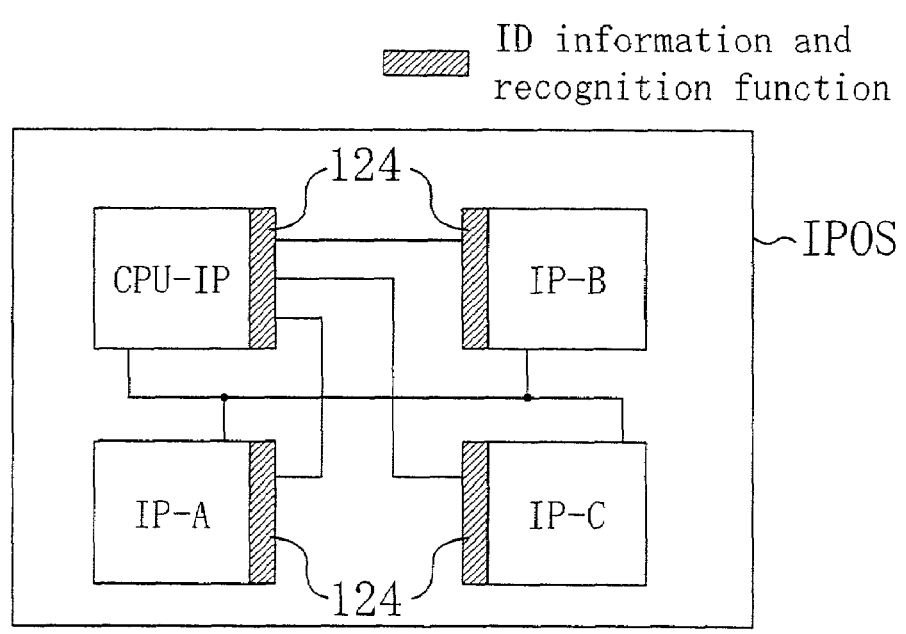
FIG. 25 is a block circuit diagram showing the configuration of an IPOS device according to a second specific example of the sixth embodiment.

FIG. 25 is a block circuit diagram showing the configuration of an IPOS device according to a second specific example of the present embodiment. As shown in FIG. 25, the IPOS device of this specific example is provided with a CPU-IP and peripheral IPs IP-A, IP-B, and IP-C, and the CPU-IP, IP-A, IP-B, and IP-C incorporate ID information and a recognition function 124. Moreover, the CPU-IP, which incorporates ID information and the recognition function 124, stops certain functions or performs controls for making selections from among a plurality of functions.

Thus, among the effects that can be achieved, it becomes unnecessary to change the peripheral IPs (chip) for each CPU-IP and the structure of the IPOS device can be shared for a wide variety of CPU-IPs, and the reuse of universal peripheral IPs (chips) incorporating multiple types of CPU-IP functions (bus interfaces) can be achieved.

THIRD SPECIFIC EXAMPLE

FIG. 26 is a block circuit diagram showing the configuration of an IPOS device in a third specific example of the present embodiment. As shown in FIG. 26, the IPOS device of this specific example is provided with a CPU-IP, a recognition software IP 126 (memory storage contents), and peripheral IPs IP-A, IP-B, and IP-C, and the CPU-IP, IP-A, IP-B, and IP-C incorporate ID information 122. Moreover, the peripheral IPs are accessed from the CPU-IP and the ID information 122 incorporated by each IP is read out to perform controls for stopping and selecting unnecessary functions from information within the recognition software 126. For example, flags are set in the register to stop unnecessary functions.

Thus, among the effects that can be achieved, it becomes possible select peripheral IP (chip) functions by only changing the contents stored in the memory, it becomes possible to read out the ID information of the peripheral IPs, and once an LSI is configured, its functions can be changed simply by changing the recognition software (memory) without changing the hardware.

SEVENTH EMBODIMENT

Next, a seventh embodiment relating to the configuration of IPs wherein IPs actually verify one another, and which is required when controlling the IPs with the system control portion or software, is described below. The present embodiment is suited for carrying out function selection controls in the above-described first, second, and third embodiments, for example, and in particular in the sixth specific example of the second embodiment. ID information in the present embodiment is expressed as an n-bit register, for example.

For this case, the methods of the following specific examples can serve as methods for choosing functions to be restricted.

FIRST SPECIFIC EXAMPLE

Figure 27:
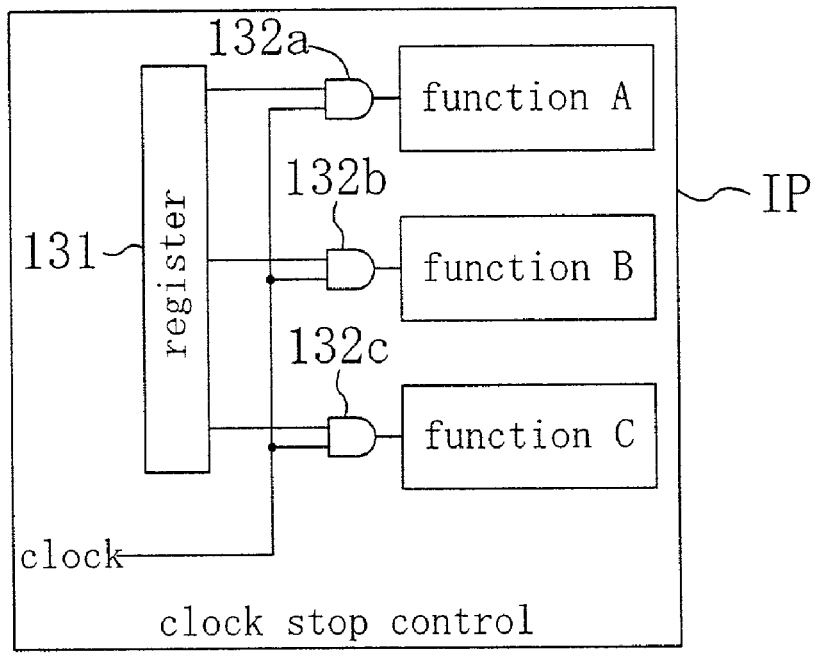
FIG. 27 is a block circuit diagram showing the configuration and method for clock stop control in a first specific example of a seventh embodiment.

FIG. 27 is a block circuit diagram showing the configuration and method for clock stop controls in a first specific example of the present embodiment. As shown in FIG. 27, an IP is provided with a register 131 corresponding to function information, and AND circuits 132a, 132b, and 132c for receiving the output of the register 131 and the clock, and for outputting the results of an AND computation to the functions A, B, and C. That is, this method is for presetting necessary functions from among the functions A, B, and C to the register 131 to stop the clock input to unnecessary functions.

SECOND SPECIFIC EXAMPLE

Figure 28:
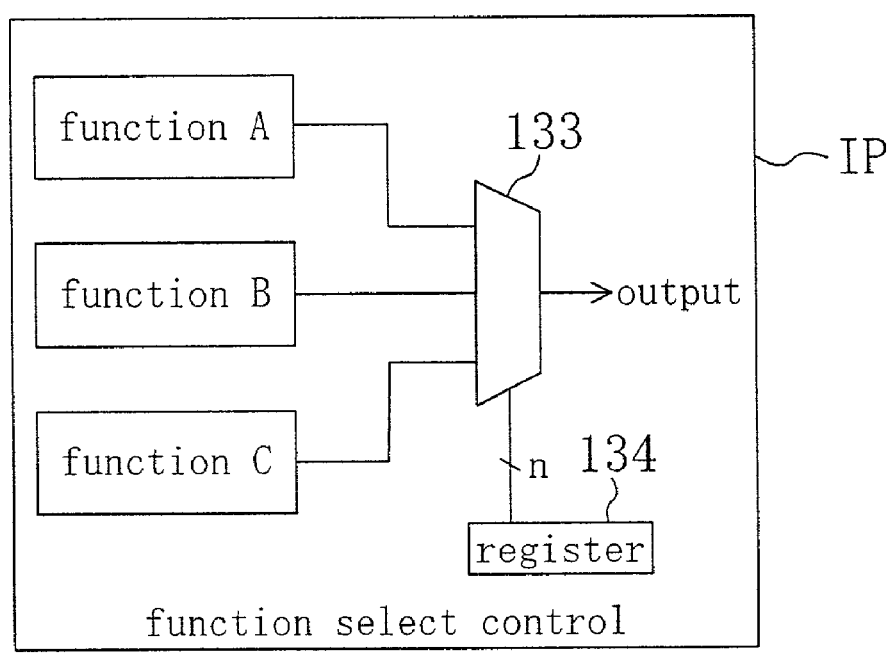
FIG. 28 is a block circuit diagram showing the configuration and method for function select control in a second specific example of the seventh embodiment.

FIG. 28 is a block circuit diagram showing the configuration and method for function select control in a second specific example of the present embodiment. As shown in FIG. 28, an IP is provided with a selector 133 for selecting any one of the functions A, B, or C, and a register 134 corresponding to function information. That is, in this method, necessary functions from among the functions A, B, and C are preset in the register 134 to stop the output of unnecessary functions.

THIRD SPECIFIC EXAMPLE

Figure 29:
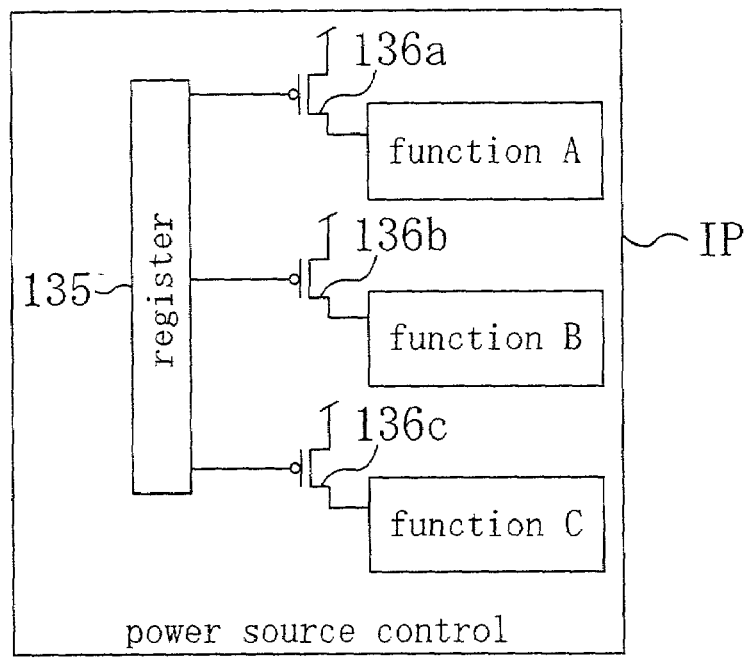
FIG. 29 is a block circuit diagram showing the configuration and method for power source control in a third specific example of the seventh embodiment.

FIG. 29 is a block circuit diagram showing the configuration and method for power source control in a third specific example of the present embodiment. As shown in FIG. 29, an IP is provided with a register 135 corresponding to function information, and MOS transistors 136a, 136b, and 136c for receiving the output of the register 135 at their gates and outputting power source voltage VDD to the functions A, B, and C. That is, with this method a necessary function from among the functions A, B, and C is preset to the register 135 to stop the supply of power source voltage to unnecessary functions.

FOURTH SPECIFIC EXAMPLE

Figure 30:
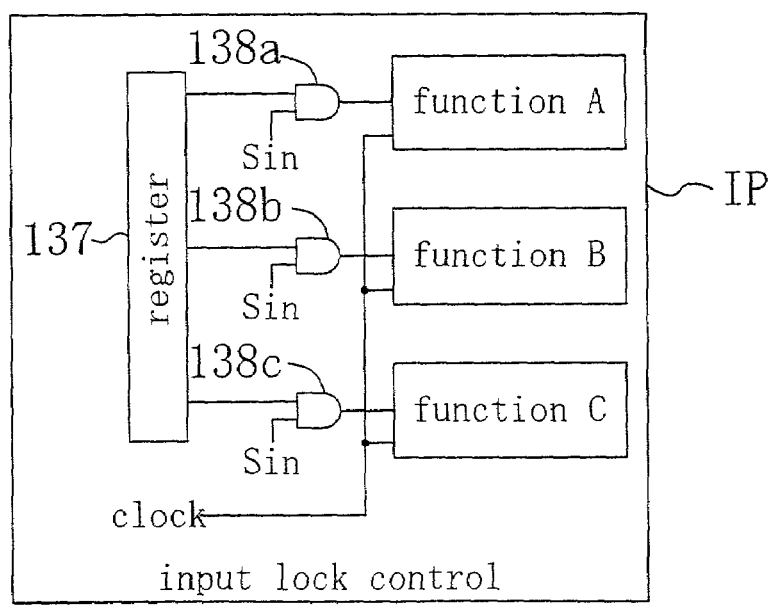
FIG. 30 is a block circuit diagram showing the configuration and method for input lock control in a fourth specific example of the seventh embodiment.

FIG. 30 is a block circuit diagram showing the configuration and method for input lock control in a fourth specific example of the present embodiment. As shown in FIG. 30, an IP is provided with a register 137 corresponding to function information, and AND circuits 138a, 138b, and 138c for receiving the output of the register 137 and the input signal Sin and outputting the results of an AND computation to the functions A, B, and C. That is, this method is for presetting a necessary function from among the functions A, B, and C into the register 137 to restrict input of the input signal Sin to unnecessary functions.

It should be noted that the above-mentioned specific examples are also applicable to the first embodiment when a wiring structure is used in place of the register.

SPECIFIC EXAMPLE OF ADDRESS RECONSTRUCTION

Figure 31:
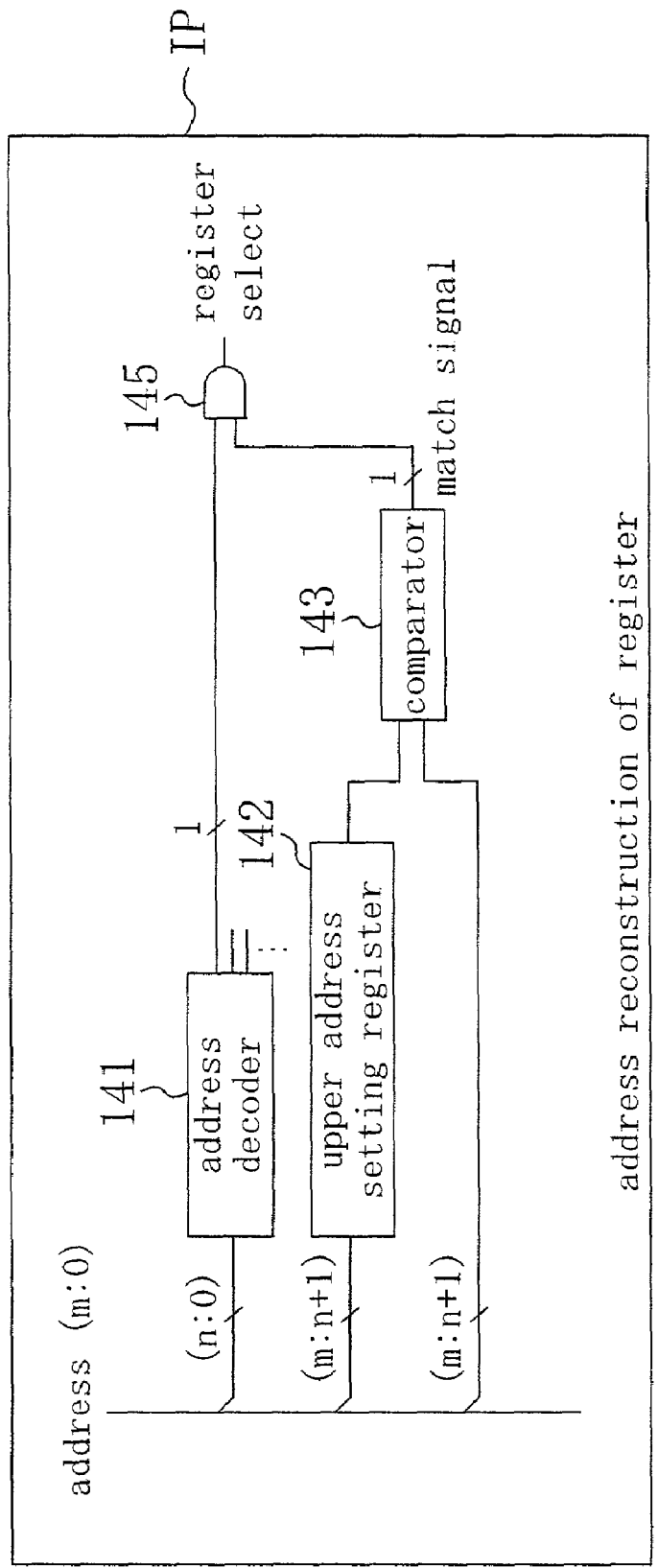
FIG. 31 is a block circuit diagram showing an example of the configuration and method for reconstructing the address of a register applicable to the specific examples of the seventh embodiment.

FIG. 31 is a block circuit diagram showing an example of the configuration and method for reconstructing the address of a register applicable to the above-described specific examples. An IP is provided with an address decoder 141 for receiving an input address having a bit width going from m to 0 and decoding the bit width portion from n (n<m) to 0 thereof, an upper address setting register 142 for registering, as an upper address, the bit width portion from m to n+1 of the input addresses having a bit width from m to 0, a comparator 143 for comparing the upper address from m to n+1 that is stored in the address setting register 142 with the upper address from m to n+1 of the input address, and when those two are matching, outputting a match signal, and an AND circuit 145 for ANDing the match signal from the comparator 143 with the output of the address decoder 141 and outputting those results.

That is, the address of peripheral IPs is usually configured by a number of bits going from n to 0, and for the entire system, the address begins from m (m>n). At that time, the host side sets and allocates upper addresses from m to n+1 in the register for each of the peripheral IPs. Access from the host side is done with input addresses of a bit width of 0 from m, however, if the comparator 143 compares the upper addresses of those input addresses with the upper addresses set in the address setting register 142 and finds that they are matching, it outputs a matched signal. On the other hand, lower addresses of the inputted addresses are decoded through the address decoder 141. Then, whether they have been set by the register can be determined by calculating the AND of these and the matched signal. Thus, it is possible to automatically divide the address mapping.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A semiconductor device, comprising:
   a semiconductor circuit board having wiring layers and an evaluation wiring layer; and
   a plurality of chips used for evaluation, each chip having at least one function, that are mounted by lamination on the semiconductor circuit board,
   wherein said evaluation wiring layer is removed or disabled after performing an evaluation process.

2. The semiconductor device in accordance with claim 1,
   wherein said wiring layer of said semiconductor circuit board comprises a wiring layer used for normal function, and said evaluation a wiring layer is provided above said wiring layer used for normal function; and
   wherein said plurality of chips are electrically connected to said wiring layer used for evaluation.

3. A semiconductor device, comprising:
   a semiconductor circuit board having a wiring layer;
   a plurality of chips, each chip having at least one function of a plurality of functions, that are mounted by lamination on the semiconductor circuit board; and
   a function selection means for keeping at least one function of each chip activated.

4. The semiconductor device in accordance with claim 3,
   wherein the function selection means provides a logic signal to be applied to the plurality of functions.

5. The semiconductor device in accordance with claim 3,
   wherein said function selection means is a selector that is connected to said plurality of functions, receives a logic input, and outputs only said at least one function of said plurality of functions.

6. The semiconductor device in accordance with claim 5,
   wherein said wiring layer is provided with a power source wiring for supplying a power source voltage, and a ground wiring for supplying a ground voltage;
   wherein said semiconductor device further comprises a connection means for connecting either said power source wiring or said ground wiring to said selector; and
   wherein the logic input is said power source voltage or said ground voltage.

7. The semiconductor device in accordance with claim 3,
   wherein the function selection means is a connection means for connecting said at least one function of said plurality of functions to said wiring layer.

8. The semiconductor device in accordance with claim 3,
   further comprising a chip that is provided on the semiconductor circuit board, that is connected via said wiring layer to said at least one function of said plurality of functions of said plurality of chips, and that has a control circuit that performs control such that only said at least one function of said plurality of functions is selected.

9. The semiconductor device in accordance with claim 3,
   further comprising a storage means for storing which of said plurality of functions are to be activated or which are not to be activated, the storage means being connected to said at least one function of said plurality of functions of said plurality of chips; and
   a setting means for setting the storage in said storage means such that only said at least one function of said plurality of functions is activated.

10. The semiconductor device in accordance with claim 9,
    wherein the setting means is connected to the storage means over a network.

11. A semiconductor device, comprising:
    a semiconductor circuit board having a wiring layer;
    a chip having at least one function of a plurality of functions, that is mounted by lamination on the semiconductor circuit board; and
    a function information storage means for storing function information related to said at least one function of said plurality of functions, said function information storage means being provided in said chip.

12. The semiconductor device in accordance with claim 11,
    wherein said function information storage means stores function information by associating said plurality of functions with ID numbers.

13. The semiconductor device in accordance with claim 11,
    wherein said function information related to said at least one function of said plurality of functions is formatted so that it can be displayed on a display means.

14. The semiconductor device in accordance with claim 11,
    further comprising a second chip that is configured so as to determine at least one function of said second chip by receiving said function information from said chip.

15. The semiconductor device in accordance with claim 11,
    wherein said chip is configured to output said function information stored in said function information storage means when receiving a key signal.

16. The semiconductor device in accordance with claim 11,
    further comprising an encryption means for encrypting said function information outputted by said function information storage means.

17. The semiconductor device in accordance with claim 16,
    further comprising a decryption means for decrypting and outputting said encrypted function information when a key signal has been received.

18. A semiconductor device, comprising:
    a semiconductor circuit board having a wiring layer;
    a plurality of chips, each chip having at least one function of a plurality of functions, that are mounted by lamination on the semiconductor circuit board; and
    a function information storage means for storing information related to said at least one function of said plurality of functions, said function information storage means being provided in each chip;
    wherein said plurality of chips are configured so that they can read out function information by accessing said function information storage means of other said plurality of chips.

19. The semiconductor device in accordance with claim 18,
    wherein each of said plurality of chips is provided with a key signal communication portion for sending and receiving a key signal, and each of said plurality of chips is configured so that each outputs said function information stored in said function information storage means when said key signal communication portion of each of said plurality of chips has received said key signal.

20. The semiconductor device in accordance with claim 19,
    wherein said plurality of chips are configured so as to perform a communication of said function information after said function information of said function information storage means has been decoded into a code that can be mutually recognized.

21. The semiconductor device in accordance with claim 18,
   wherein said function information storage means store said function information by associating each of said at least one function of said plurality of functions with an ID number; and
   wherein said semiconductor device further comprises a function recognition means for recognizing said function information based on said ID number.

22. The semiconductor device in accordance with claim 21,
   wherein said function recognition means is provided in a second chip distinct from said plurality of chips.

23. The semiconductor device in accordance with claim 22,
   wherein said function recognition means is provided as storage content of a memory.

24. The semiconductor device in accordance with claim 21,
   wherein said function recognition means is provided in one piece with said function information storage means in said plurality of chips.

25. The semiconductor device in accordance with claim 21,
   wherein said function information storage means comprise a first storage portion storing the lower n bits of an m bit address (with n<m) used in said semiconductor device, and a second storage portion storing the upper bits from (n+1) upward of the m bit address as said ID number; and
   wherein said semiconductor device further comprises a means for judging whether said upper bits from (n+1) upward of the m bit address match with said ID number of said second storage portion.

26. The semiconductor device in accordance with claim 19,
   wherein said plurality of chips are configured such that they can change or set their own functions based on function information of said function information storage means in the other said plurality of chips.

27. The semiconductor device in accordance with claim 26,
   further comprising a control circuit that changes or sets the functions of said plurality of chips upon receiving storage information of said function information storage means in said plurality of chips.

28. A semiconductor device, comprising:
   a semiconductor circuit board having a wiring layers;
   a plurality of chips, each chip having at least one function, that are mounted by lamination on the semiconductor circuit board; and
   a bus chip comprising a bus that connects said plurality of chips to one another,
   wherein at least one wiring layer is removed or disabled after performing an evaluation process.

29. The semiconductor device in accordance with claim 11, wherein a function information storage means is provided in each of a plurality of chips.

30. The semiconductor device in accordance with claim 11, wherein said storing function information is selected from one of the group consisting of identification codes, manufacturing history, function category, specifications, and documentation.

* * * * *

UNITED STATES PATENT AND TRADEMARK OFFICE
CERTIFICATE OF CORRECTION

PATENT NO. : 7,148,503 B1  Page 1 of 1
APPLICATION NO. : 09/968898
DATED : December 12, 2006
INVENTOR(S) : Katsuya Fujimura et al.

It is certified that error appears in the above-identified patent and that said Letters Patent is hereby corrected as shown below:

On the title page of the Letters Patent,

Under Item "(30) Foreign Application Priority Data", change "May 10, 2000" to -- October 5, 2000 --

Signed and Sealed this

Twenty-fifth Day of September, 2007

JON W. DUDAS
*Director of the United States Patent and Trademark Office*